(12) United States Patent
Matthews et al.

(10) Patent No.: US 10,114,050 B2
(45) Date of Patent: Oct. 30, 2018

(54) UTILITY CONSUMPTION IDENTIFICATION

(75) Inventors: Alexander Matthews, Oxford (GB);
James Donaldson, Oxford (GB);
Semen Trygubenko, Oxford (GB);
Alex Wilson, Oxford (GB)

(73) Assignee: Sensus USA Inc., Raleigh, NC (US)

( * ) Notice: Subject to any disclaimer, the term of this patent is extended or adjusted under 35 U.S.C. 154(b) by 739 days.

(21) Appl. No.: 14/241,347

(22) PCT Filed: Aug. 24, 2012

(86) PCT No.: PCT/GB2012/052090
§ 371 (c)(1),
(2), (4) Date: Feb. 26, 2014

(87) PCT Pub. No.: WO2013/030552
PCT Pub. Date: Mar. 7, 2013

(65) Prior Publication Data
US 2014/0214221 A1     Jul. 31, 2014

(30) Foreign Application Priority Data

Aug. 26, 2011    (GB) .................................. 1114814.5

(51) Int. Cl.
*G01R 21/133* (2006.01)
*G01D 4/00* (2006.01)

(52) U.S. Cl.
CPC ........... *G01R 21/133* (2013.01); *G01D 4/004* (2013.01); *Y02B 90/242* (2013.01); *Y04S 20/322* (2013.01); *Y04S 20/38* (2013.01)

(58) Field of Classification Search
None
See application file for complete search history.

(56) References Cited

U.S. PATENT DOCUMENTS

| 4,858,141 A | 8/1989 | Hart |
|---|---|---|
| 5,483,153 A | 1/1996 | Leeb |

(Continued)

OTHER PUBLICATIONS

Arulampalam, M. Sanjeev. A Tutorial on Particle Filters for Online Nonlinear/Non-Gaussian Bayesian Tracking IEEE Transactions on Signal Processing, vol. 50, No. 2, Feb. 2002.

(Continued)

*Primary Examiner* — Sean Shechtman
(74) *Attorney, Agent, or Firm* — Andrus Intellectual Property Law, LLP

(57) ABSTRACT

A method of identifying consumption of a utility by devices in a group of devices, wherein each device in the group of devices has a plurality of device-states and is arranged to consume the utility, the method comprising, for a given measurement period in a supply of the utility to the group of devices: obtaining a time-based vector of total levels of consumption of the utility by the group of devices during the given measurement period; for each of a plurality of group-states, wherein each group-state corresponds to each device in the group of devices being in a corresponding device-state, calculating a score representing a likelihood that the group of devices is in the group-state during the given measurement period, wherein said score is based on a likelihood of the obtained vector occurring based on a multivariate statistical model, corresponding to the group-state, of the total level of consumption of the utility by the group of devices during a measurement period in the supply of the utility to the group of devices when the group of devices is in the group-state; and identifying, based at least in part on the calculated scores, a most likely group-state for the group of devices.

32 Claims, 7 Drawing Sheets

(56) References Cited

U.S. PATENT DOCUMENTS

| | | | | |
|---|---|---|---|---|
| 2011/0144819 A1* | 6/2011 | Andrews | ............... | G01D 4/004 700/291 |
| 2011/0307200 A1* | 12/2011 | Hsu | ...................... | G06Q 50/06 702/61 |

OTHER PUBLICATIONS

Filippi, A.. Multi-appliance power disaggregation: An approach to energy monitoring Energy Conference and Exhibition (EnergyCon), 2010 IEEE International.

Galeano, Pedro ,et al. Multivariate analysis in vector time series. Aug. 4, 2000.

Hart, George W., Nonintrusive Appliance Load Monitoring. Proceedings of the IEEE, vol. 80, No. 12, Dec. 1992.

Hofbaur, Michael W., Hybrid estimation of complex systems. IEEE Transactions on Systems, Man, and Cybernetics—Part B: Cybernetics, vol. 34, No. 5, Oct. 2004.

International Patent Application No. PCT.GB2012/052090. International Search Report dated Dec. 7, 2012.

Lee, Soon. A reduced multivariate-polynomial model for estimation of electric load composition. Industry Applications Conference, 2007. 42nd IAS Annual Meeting. Conference Record of the 2007 IEEE.

Mackay, David J.C., Ensemble Learning for Hidden Markov Models, Unpublished manuscript. Cambridge: Department of Physics, University of Cambridge. 1997.

Ruzzelli, Antonio G. Ruzzelli. Real-time recognition and profiling of appliances through a single electricity sensor. Sensor Mesh and Ad Hoc Communications and Networks (SECON), 2010 7th Annual IEEE Communications Society Conference.

UK Application No. GB1114814.5, United Kingdom Search and Examination Report Dated Dec. 17, 2012.

Zeifman, Michael. Non-intrusive appliance load monitoring: Review and outlook. International Conference on Consumer Electronics Las Vegas Jan. 10, 2011.

Zymnis, Argyrios. Mixed state estimation for a linear Gaussian Markov model Proceedings of the 47th IEEE Conference on Decision and Control Cancun, Mexico, Dec. 9-11, 2008.

* cited by examiner

UTILITY CONSUMPTION IDENTIFICATION

FIELD OF THE INVENTION

This invention relates to methods and apparatus for identifying consumption of a utility by devices in a group of devices.

BACKGROUND OF THE INVENTION

For both cost and environmental reasons, consumers (be they individuals, businesses, etc.) are under increasing pressure to reduce the consumption of utilities such as electricity, water and gas. Methods of so-called non-intrusive load monitoring (NILM) have been developed, which involve measuring a level of consumption of a utility by a site and then identifying which particular appliances are consuming the utility at any point in time.

The majority of NILM solutions use techniques known as "event-based" techniques. In these techniques, a utility consumption profile of the site is recorded and analysed to look for significant changes in the state of utility consumption by the site (caused, for example, by devices at the site being turned on or off). FIG. 1 of the accompanying drawings shows a typical utility consumption profile for a domestic site. In such a utility consumption profile, changes in the utility consumption of the site can be seen and the devices which are causing the change in utility consumption may be inferred using heuristic algorithms. Examples of using event-based techniques in NILM can be seen in: Hart, G. W., "Nonintrusive appliance load monitoring", *Proceedings of the IEEE*, 80, 1870-1891; and in U.S. Pat. No. 4,858,141 and U.S. Pat. No. 5,483,153.

While event-based techniques can provide reasonable results in some circumstances, they suffer from a number of significant limitations. Firstly, to calculate the magnitude of utility consumption by a device, it is necessary to sample the utility consumption profile at points which are either side of the change in state of the device. Hence the accuracy of this technique is limited by the noise in the utility consumption profile.

Secondly, for situations where multiple devices are changing state simultaneously or where multiple devices are changing state in quick succession, the profile indicating a change of state of an individual device may be obscured or distorted by a change in the state of one or more other devices. This may happen at a commercial site, for example. FIG. 2 of the accompanying drawings shows a utility consumption profile which has been recorded at a factory. In a situation such as this, where a large number of devices are installed and many devices are changing state simultaneously or in quick succession, the utility consumption profile is too complicated for event-based techniques to successfully analyse.

It would therefore be desirable to provide an improved method of non-intrusive load monitoring.

SUMMARY OF THE INVENTION

According to a first aspect of the invention, there is provided a method of identifying consumption of a utility by devices in a group of devices, wherein each device in the group of devices has a plurality of device-states and is arranged to consume the utility, the method comprising, for a given measurement period in a supply of the utility to the group of devices: obtaining a time-based vector of total levels of consumption of the utility by the group of devices during the given measurement period; for each of a plurality of group-states, wherein each group-state corresponds to each device in the group of devices being in a corresponding device-state, calculating a score representing a likelihood that the group of devices is in the group-state during the given measurement period, wherein said score is based on a likelihood of the obtained vector occurring based on a multivariate statistical model, corresponding to the group-state, of the total level of consumption of the utility by the group of devices during a measurement period in the supply of the utility to the group of devices when the group of devices is in the group-state; and identifying, based at least in part on the calculated scores, a most likely group-state for the group of devices. Such a method has been found to provide a more reliable and accurate method of non-intrusive load monitoring, especially in scenarios in which there is a large number of devices in operation and/or in which the devices that are being operated change their state frequently.

In some embodiments, the multivariate statistical model for a group-state is based on: a predetermined mean vector, $\mu$, representing a mean of a group of vectors, each vector in the group of vectors being a time-based vector, corresponding to the obtained time-based vector, of total levels of consumption of the utility by the group of devices during a respective measurement period when the group of devices is in the group-state; and a predetermined covariance matrix, C, representing a covariance matrix for the group of vectors.

The predetermined covariance matrix of the multivariate statistical model for each group-state may be regularized with a regularization parameters so that the condition number of each of the predetermined covariance matrices is at most a predetermined value.

The multivariate statistical model for a group-state may then be based on a multivariate Gaussian model representable by a probability density function f(x), where $$f(x) = \frac{1}{(2\pi)^{N/2}|C|^{1/2}} e^{-\frac{1}{2}(x-\mu)^T C^{-1}(x-\mu)},$$

where x represents the obtained time-based vector, N is the length of the predetermined mean vector, and |C| is the determinant of the predetermined covariance matrix C.

In some embodiment, said score is calculated based on the value $\alpha(x-\mu)^T C^{-1}(x-\mu)+\beta \ln(|C|)+\gamma$, wherein $\alpha$, $\beta$ and $\gamma$ are constants.

In some embodiments, the multivariate statistical model for a group-state is based on one of a multivariate exponential model, a multivariate gamma model, a multivariate Poisson model, or a multivariate Cauchy-Lorentz model of total levels of consumption of the utility by the group of devices during a respective measurement period when the group of devices is in the group-state.

In some embodiments, the method comprises determining, based on the multivariate statistical model of the identified most likely group-state, a time-based vector representing estimated levels of consumption of the utility by a given device in the group of devices during the given measurement period.

In this case, the multivariate statistical model for a group-state may comprise a predetermined mean vector for the given device representing a mean of a set of vectors, each vector in the set of vectors being a time-based vector, corresponding to the obtained time-based vector, of levels of consumption of the utility by the given device during a respective measurement period when said device is in the device-state corresponding to the group-state; and the determined time-based vector representing estimated levels of consumption of the utility by the given device during the given measurement period may be the predetermined mean vector for the given device of the multivariate statistical model of the identified most likely group-state.

The multivariate statistical model for a group-state may comprise, for each device, d, in the group of devices: a corresponding predetermined mean vector, $\mu_d$, representing a mean of a set of vectors, each vector in the set of vectors being a time-based vector, corresponding to the obtained time-based vector, of levels of consumption of the utility by the device d during a respective measurement period when said device is in the device-state corresponding to the group-state; and a corresponding predetermined covariance matrix, $C_d$, representing a covariance matrix of the set of vectors; wherein the time-based vector representing estimated levels of consumption of the utility by the given device during the given measurement period is determined based on the obtained time-based vector and the predetermined mean vectors corresponding to the devices in the group of devices and the predetermined covariance matrices corresponding to the devices in the group of devices.

The time-based vector representing estimated levels of consumption of the utility by the given device during the given measurement period may be determined based on the formula:

$$x_i = C_i \left( \sum_{d \in D} C_d \right)^{-1} \left( x - \sum_{d \in D} \mu_d \right) + \mu_i$$

where: x represents the obtained time-based vector; D represents the group of devices; $\mu_i$ represents the predetermined mean vector corresponding to the given device; $C_i$ represents the predetermined covariance matrix corresponding to the given device; and $x_i$ represents the time-based vector representing estimated levels of consumption of the utility by the given device during the given measurement period.

The predetermined mean vector $\mu$ may be the sum of the predetermined mean vectors corresponding to the devices in the group of devices and the predetermined covariance matrix C may be the sum of the predetermined covariance matrices corresponding to the devices in the group of devices.

The utility may be electricity and a "level of consumption of the utility" may then be a level of consumption of current.

In some embodiments, the method further comprises identifying that the most likely group-state for the group of devices is not one of the plurality of group-states. In this case, the most likely group-state for the group of devices may be identified as not being one of the plurality of group-states based on a comparison of the calculated scores, or a function of the calculated scores, with a predetermined threshold.

In some embodiments, said identifying a most likely group-state for the group of devices may be based, at least in part, on an obtained time-based vector of total levels of consumption of the utility by the group of devices during one or more measurement periods preceding and/or succeeding the given measurement period or based, at least in part, on an identified most likely group-state for one or more measurement periods preceding and/or succeeding the given measurement period. In this case, said identifying a most likely group-state for the group of devices may comprise using a hidden Markov model for the most likely group-state for the group of devices.

The supply of the utility to the group of devices may have a cyclic component and a measurement period may then correspond to one or more cycles of the cyclic component.

The consumption of the utility by a device in the group of devices may be dependent upon a current device-state for that device.

The method may comprise selecting the plurality of group-states from a larger set of possible group-states for the group of devices. The plurality of group-states may be selected as a set of most likely group-states for the group of devices out of the set of possible group-states for the group of devices based on a currently-identified group-state for the group of devices. The plurality of group-states may be selected using a particle filtering process. The plurality of group-states may be selected using a set of transition probabilities. Each transition probability may indicate, for a corresponding first group-state and a corresponding second group-state, a probability that the group of devices will be in the second group-state during a measurement period if the group of devices was in the first group-state during an immediately preceding measurement period.

According to a second aspect of the invention, there is provided a method of determining an indication of a level of consumption of electricity by a given device, the given device being a device in a group of devices that are each arranged to consume electricity, the method comprising, for a given measurement period in a supply of electricity to the group of devices: obtaining a time-based vector of total levels of current consumed by the group of devices during the given measurement period; and determining a corresponding time-based vector representing estimated levels of consumption of current by the given device during the given measurement period based on the formula:

$$x_i = C_i \left( \sum_{d \in D} C_d \right)^{-1} \left( x - \sum_{d \in D} \mu_d \right) + \mu_i$$

where: x represents the obtained time-based vector; D represents the group of devices; for each device d in the group of devices, $\mu_d$ is a corresponding predetermined mean vector representing a mean of a set of vectors, each vector in the set of vectors being a time-based vector, corresponding to the obtained time-based vector, of levels of consumption of the current by the device d during a respective measurement period and $C_d$ is a corresponding predetermined covariance matrix representing a covariance matrix of the set of vectors; $\mu_i$ represents the predetermined mean vector corresponding to the given device; $C_i$ represents the predetermined covariance matrix corresponding to the given device; and $x_i$ represents the time-based vector representing estimated levels of consumption of current by the given device during the given measurement period. Such a method has been found to provide a more accurate estimate of the level of consumption of electricity by a device.

The above methods may comprise obtaining a time-based vector of voltage levels of the supply of electricity to the group of devices during the measurement period corresponding to the obtained time-based vector of total levels of current consumed by the group of devices during the given measurement period; and determining an indication of electrical power consumption by the given device during the given measurement period based on the time-based vector of voltage levels of the supply of electricity to the group of devices during the given measurement period and the time-based vector representing estimated levels of consumption of current by the given device during the given measurement period.

According to a third aspect of the invention, there is provided a method of enabling identification of consumption of a utility by devices in a group of devices, said identification to be performed by carrying out a method according to the above first aspect of the invention, comprising: generating and providing said predetermined mean vector, g, representing a mean of said group of vectors; and generating and providing said predetermined covariance matrix, C, representing a covariance matrix of said group of vectors.

According to a fourth aspect of the invention, there is provided an apparatus arranged to carry out any one of the above-described methods.

According to a fifth aspect of the invention, there is provided a computer program which, when executed by a processor, causes the processor to carry out any one of the above-described methods.

According to a sixth aspect of the invention, there is provided a data carrying medium carrying a computer program according to the fifth aspect of the invention.

BRIEF DESCRIPTION OF THE DRAWINGS

Embodiments of the invention will now be described, by way of example only, with reference to the accompanying drawings, in which.

DETAILED DESCRIPTION OF EMBODIMENTS OF THE INVENTION

In the description that follows and in the figures, certain embodiments of the invention are described. However, it will be appreciated that the invention is not limited to the embodiments that are described and that some embodiments may not include all of the features that are described below. It will be evident, however, that various modifications and changes may be made herein without departing from the broader spirit and scope of the invention as set forth in the appended claims.

Figure 3:
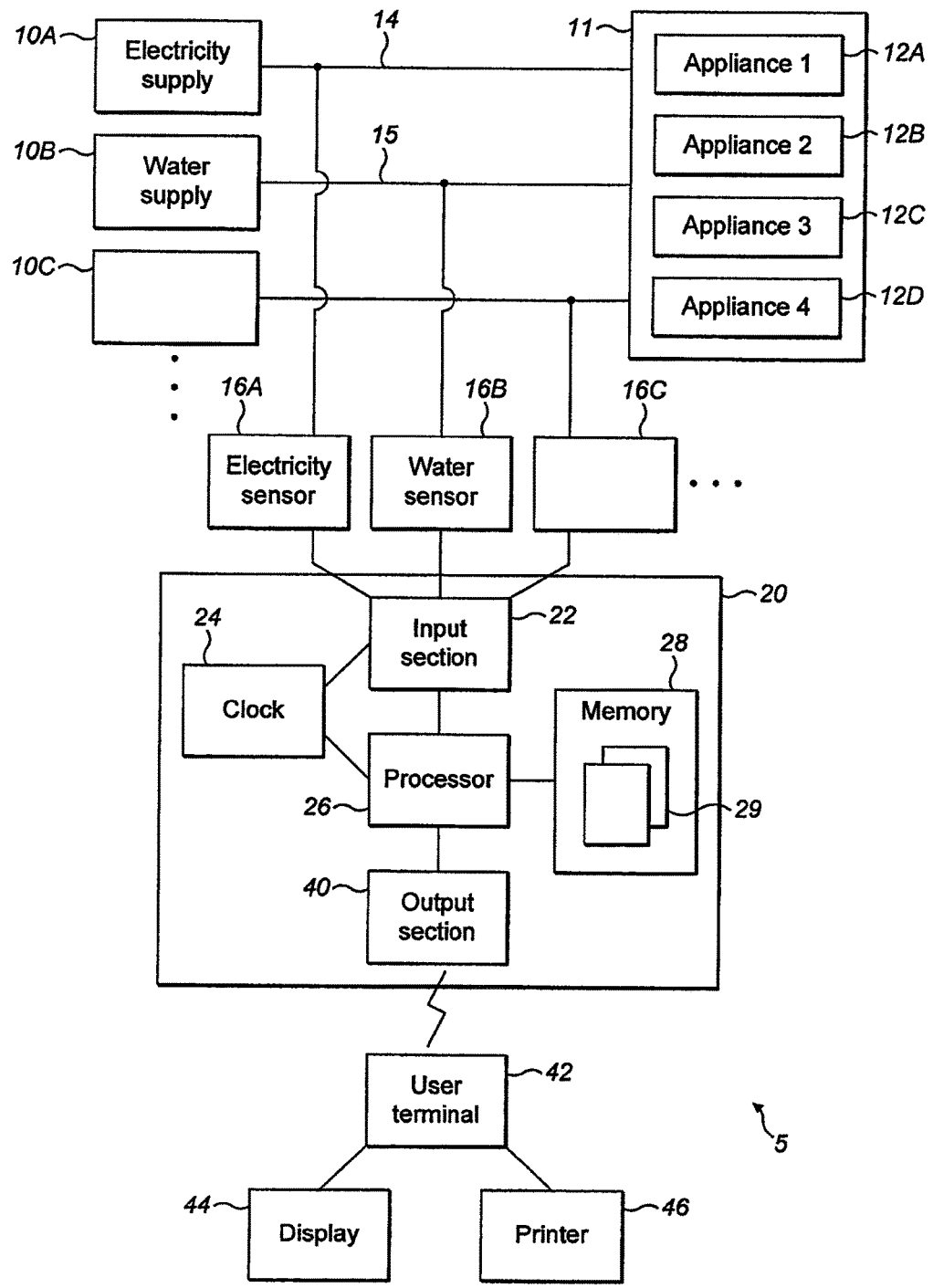
FIG. 3 schematically illustrates a system according to an embodiment of the invention.

FIG. 3 schematically illustrates a system 5 according to an embodiment of the invention. The system 5 comprises a site 11, e.g. a house, apartment, office, shop, school, building, factory, etc. One or more appliances (or devices, machines, pieces of equipment) 12A, 12B, 12C, 12D . . . are located at, or form part of, the site 11. The group of appliances 12 may range from any domestic appliances (such as washing machines, refrigerators, hair dryers, light bulb, etc.) to any industrial or commercial appliances. The appliances 12, in operation, are arranged to use or consume one or more utilities, such as electricity, gas (e.g. natural gas), water, oil, etc. There may be a group of appliances 12 that are arranged to consume a single utility (such as a hair dryer consuming only electricity) whereas there may be other groups of appliances 12 that are arranged to consume a plurality of utilities (such as a dish washer consuming both water and electricity).

In the system 5, an electricity supply 10A is arranged to provide electricity to one or more of the appliances 12 that are arranged to consume electricity. The electricity is supplied to these appliances 12 by means of conventional wiring 14. The appliances 12 and wiring 14 are simply shown schematically in FIG. 3, but may, of course, be configured in any appropriate way, such as via a consumer unit with circuit breakers or fuses, and with one or more ring main circuits with branches or spurs. An electricity meter (or sensor or detector) 16A is provided to measure (or sense or detect) the total instantaneous supply of electricity from the electricity supply 10A to the site 11 (i.e. to the group of appliances 12 at the site 11 that are arranged to consume electricity), or, in other words, measure the current combined (or aggregated) amount of electricity being consumed by the group of appliances 12 at the site 11.

In the system 5, a water supply 10B is arranged to provide water to one or more of the appliances 12 that are arranged to consume water. The water is supplied to these appliances 12 by means of conventional piping 15 (which may include valves, taps, etc). A water meter (or sensor or detector) 16B is provided to measure (or sense or detect) the total instantaneous supply of water from the water supply 10B to the site 11 (i.e. to the group of appliances 12 at the site 11 that are arranged to consume water), or, in other words, measure the current combined (or aggregated) amount of water being consumed by the group of appliances 12 at the site 11.

Some appliances 12 may additionally or alternatively be connected to the supply of other utilities 10C, 10D, . . . . Corresponding utility meters 16C, 16D, . . . are provided to detect the overall utility usage of each of these other utilities by the appliances 12 at the site 11.

The electricity meter 16A may be arranged to measure the current being provided to (or consumed by) the appliances 12 from the supply 10A. The current may be measured by any suitable sensor, for example a current clamp placed around one of the conductors of the electricity supply wiring 14. The current clamp typically comprises a magnetisable material, such as ferrite, which forms a magnetic circuit around the conductor, and acts as a transformer to induce a voltage in a secondary winding around the magnetisable material, from which an indication of the current flowing in the supply wiring 14 can be obtained. As an alternative to this current-transformer, a Hall-effect sensor can be used to measure the magnetic field in the loop of magnetisable material around the wire which is related to the current flowing through the wire. Other suitable ways may, of course, be used for sensing the current.

Additionally, or alternatively, the electricity meter 16A may be arranged to measure the instantaneous voltage of the electricity supply 10A. The voltage of the electricity supply 10A may be measured by any suitable volt meter. This, of course, typically requires access to two of the conductors in the wiring 14. This can be achieved, for example, by probes which strap around the respective cables and have spikes which penetrate the insulation to make contact with the conductor. Alternatively, connections could be made to terminals in the consumer unit, or, for example, at a location where fuses or circuit breakers are insertable. Non-invasive capacitive voltage detectors could also be used.

The water meter 16B may be arranged to measure the flow (or consumption or supply) of water to the appliances 12 from the water supply 10B using any known technique of detecting the rate of supply of water through one or more water supply pipes 15 servicing the site 11. Similarly, the other meters 16C, 16D, . . . may be arranged to measure the total instantaneous supply of their respective utility to the site 11 via any corresponding suitable techniques.

It will be appreciated that different embodiments may relate to some or all of the utility supplies 10A, 10B, 10C e.g. some may relate to only monitoring/analysing electricity supply values, some may relate to only monitoring/analysing water supply values, some may relate to only monitoring/analysing gas supply values, whilst some may relate to monitoring/analysing supply values of different combinations of utilities. Consequently, in some embodiments, some of the utilities meters 16A, 16B, 16C, . . . may be omitted, depending on which particularly utility (or utilities) are to be monitored.

As shown in FIG. 3, the utility meters 16 are connected to a monitoring apparatus 20. It is, of course, possible that some or all of the utility meters 16 are incorporated within the apparatus 20, for example that wires connect the supply wiring 14 to the apparatus 20, and the current and/or voltage of the electricity supply 10A is measured within the apparatus 20. Alternatively, in a different embodiment, one or more of the utility meters 16 may be self-contained and may communicate with the apparatus 20 wirelessly and/or via a communication cable connecting a utility meter 16 with the apparatus 20, e.g. by sending analogue or digital values of the instantaneous current and instantaneous voltage. In one embodiment, the apparatus 20 can derive its own power supply by virtue of being connected to a portion of the electricity meter 16A. In one particular form of this, the apparatus 20 is simply plugged into an electrical outlet in the same way as an appliance 12 to obtain its power supply and also to measure the supply voltage and/or current. However, in the preferred embodiment, the apparatus 20 and utility meters 16 are conveniently located near where the supplied utilities enter the site 11, such as near where the conventional electricity meter is or would be located. In any case, the apparatus 20 receives utility values representative of a total level of consumption of the utility by the appliances 12.

The apparatus 20 comprises a number of different units, namely an input section 22, a clock 24, a processor 26, a store or memory 28, and an output section 40. It is possible to implement each of the various units as dedicated hardwired electronic circuits; however the various units do not have to be separate from each other, and some or all could be integrated onto a single electronic chip such as an Application Specific Integrated Circuit (ASIC) or Field Programmable Gate Array (FPGA) or Digital Signal Processor (DSP) device. Furthermore, the units can be embodied as a combination of hardware and software, and the software can be executed by any suitable general-purpose microprocessor, such that in one embodiment the apparatus 20 could be a conventional personal computer (PC), a mobile telephone or other such processing device. The software would take the form of one or more computer programs having computer instructions which, when executed by a processor (e.g. the processor 26) carry out a method according to an embodiment of the present invention as discussed below. The computer programs may be stored on a computer-readable storage medium, such as a magnetic disc, optical disc (e.g. a CD or DVD), the memory 28, etc.

When the apparatus is arranged to monitor electricity, the input section 22 of the apparatus 20 receives current and/or voltage values from the electricity meter 16A. As will be seen in FIGS. 4c and 4d, the values are input or measured preferably multiple times per cycle of an alternating electricity supply to a level of accuracy as required by the application. If the values are supplied as analogue voltages, then the input section 22 may comprise, for example, an analogue to digital converter, such that the rest of the apparatus 20 can be implemented using digital electronics. When the apparatus is arranged to monitor water, the input section 22 of the apparatus 20 receives values representative of use of water (e.g. water flow rate measurements or water pressure measurements) from the water meter 16B. Similarly, other values may be provided to the input section 22 by the other utility meters 16C, 16D, . . . (e.g. other utility flow rate measurements such as oil or gas flow rate measurements, or other utility pressure measurements such as oil or gas pressure measurements) when the apparatus is arranged to monitor those other utilities. In general, then, the input section 22 of the apparatus 20 acts as an interface that is arranged to receive (or derive or obtain) a series of utility values representative of a total level of consumption of the utility by the appliances 12. The input section 22 could form part of the processor 26.

The input section 22 also receives time data from the clock 24. The time data may represent the actual present time, a time local to the apparatus 20, or some other timing values. The time data supplied to the input section 22 could simply be a synchronisation pulse. The input section 22 may use the time data received from the clock 24 to determine when to output data values to the processor 26 and/or when to sample the inputs that it receives from the utility meters 16.

The clock 24 could, of course, be integral with other components of the apparatus 20, or the apparatus 20 could receive a clock signal from an external source such as a transmitter broadcasting time data. In one preferred embodiment the clock 24 comprises a quartz oscillator together with other timer circuitry that is an integral part of the processor 26 (described below). In this case, the input section 22 for receiving the time data may also be an integral part of the processor 26.

The processor 26 receives (or derives or obtains), from the input section 22, a series of utility values representative of a total level of consumption of the or each measured utility by the appliances 12 and performs a number of different functions as shall be described in more detail below.

The memory 28 may be any kind of memory for storing information. The memory 28 may comprise a non-volatile memory and/or a volatile memory and may comprise one or more of a magnetic disc, an optical disc, a solid-state memory, a FLASH memory, an IC-card device, a read-only-memory or a random-access-memory. The memory 28 may store one or more computer programs 29 which, when executed by the processor 26, carry out embodiments of the invention. The processor 26 may write data to (i.e. store data in) the memory 28 and/or read data from the memory 28 as part of its processing operations.

The processor 26 receives data from the input section 22 and possibly the memory 28 and possibly the clock 24. The processor 26 could be a general purpose processing device or could be a digital signal processor or could be a bespoke hardware device (e.g. FPGA or ASIC) manufactured specifically for implementing one or more embodiments of the invention. The processor 26 may store some or all of the data received from the input section 22 in the memory 28. The processor 26 then performs various processing/analysis steps which are described in detail below.

Following the processing/analysis, the processor 26 produces information regarding utility utilisation for some or all of the appliances 12. This information may be transmitted directly to the utility provider. Alternatively, this information may be output by the output section 40 to a user terminal 42 (such as a PC or a dedicated device for utility-use feedback) so that the information can be conveniently presented to the user. The user terminal 42 can be a standard desktop or laptop computer with an attached monitor/display 44 and/or printer 46, or can be a dedicated device. The user terminal 42 may comprise its own processor (not shown) for processing data (e.g. data received from the apparatus 20 and/or as an input from a user). Alternatively, the output section 40 may output the information directly to a person (e.g. visually when the output section 40 comprises a screen/display and/or audibly when the output section 40 comprises a speaker)—in this case the user terminal 42, display 44 and printer 46 may be omitted.

In some embodiments, it is the processor of the user terminal 42 (independent of or in conjunction with the processor 26 of the apparatus 20) that carries out the utility consumption processing/analysis that shall be described later.

Although the apparatus 20 and the user terminal 42 are shown as separate devices in FIG. 3, they could, of course, be part of the same device. The output section 40 in the preferred embodiment communicates wirelessly, for example by radio frequencies (RF) link, or optically, or by infrared, or acoustically. The output section 40 may be arranged to communicate via a network (be that wirelessly or via a wired network). It is also possible that the communication with the user terminal 42 is done through the supply wiring 14 if the user terminal 42 is plugged into one of the supply outlets of the site 11 as an appliance 12.

In a further embodiment, the output section 40 can also act as a receiver, such that communication between the apparatus 20 and user terminal 42 is two-way. This enables the user terminal 42 to be used as a further means for updating the apparatus 20 (e.g. to update the computer programs 29 stored in the memory 28).

As mentioned, the input section 22 of the apparatus 20 receives utility values from one or more meters 16. As will be described in more detail later, embodiments of the invention operate based on one or more time intervals, referred to below as "measurement periods", and there may be a sequence or series of measurement periods over which embodiments of the invention operate.

Figure 4A:
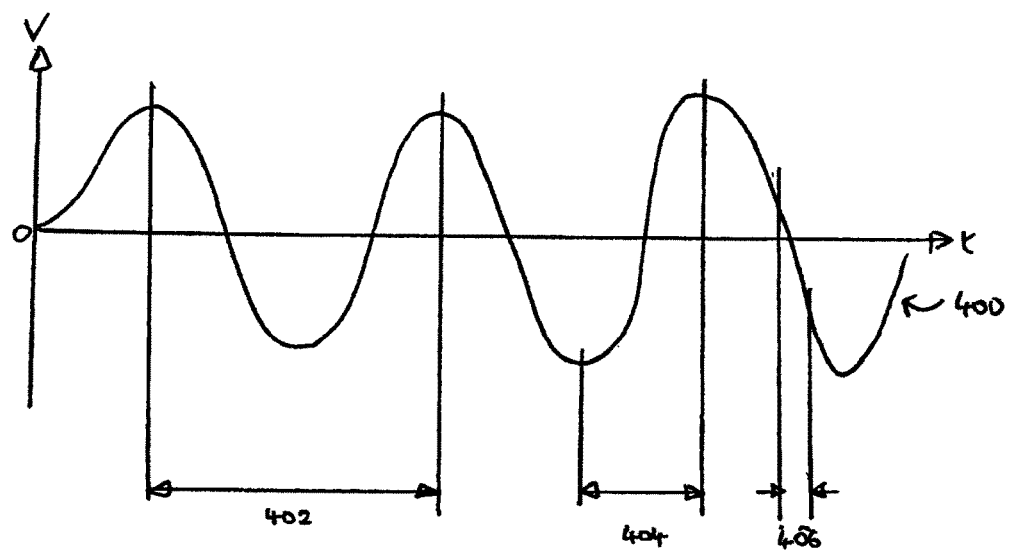
FIGS. 4a and 4b schematically illustrate examples of measurement periods.
Figure 4B:
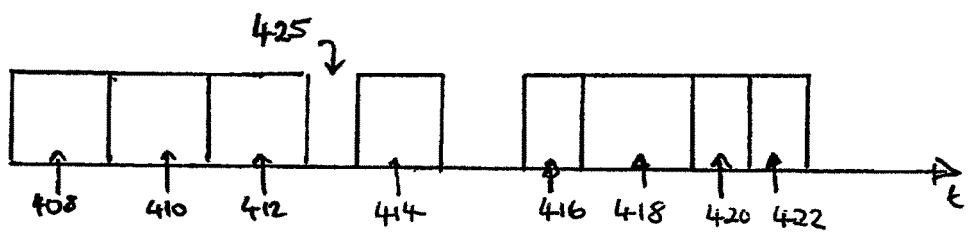

FIGS. 4a and 4b schematically illustrate examples of measurement periods.

FIG. 4a illustrates a cyclical voltage 400 of alternating electricity provided from the electricity supply 10A. A measurement period (illustrated in FIG. 4a as a measurement period 402) may correspond to a full cycle of the voltage, so that a sequence of measurement periods may then correspond to consecutive cycles. A measurement period (illustrated in FIG. 4a as a measurement period 404) may correspond to half a cycle of the voltage, so that a sequence of measurement periods may then correspond to consecutive half-cycles. A measurement period (illustrated in FIG. 4a as a measurement period 406) may correspond to some other portion of time, which may be a part of one or more cycles of the voltage (such as a quarter of a cycle or two cycles), so that a sequence of measurement periods may then correspond to consecutive periods. Whilst FIG. 4a has been described with reference to cyclical voltage of an electricity supply 10A, it will be appreciated that this description applies equally to other utility supplies with other cyclical components.

FIG. 4b illustrates the concept of a measurement period for a utility supply (such as water, oil or gas) that does not have a cyclical component. In this case, the measurement periods may correspond to any period of time. In particular, various measurement periods 408-422 are illustrated as portions of time over which measurements of utility consumption may be taken.

For both utilities that have a cyclical component (such as electricity) and utilities that do not have a cyclical component (such as water, oil or gas), the measurement periods may follow each other in an uninterrupted or contiguous sequence (for example, the measurement periods 408, 410 and 412 in FIG. 4b), or the measurement periods may be separated by a gap (such as a gap 425 illustrated in FIG. 4b). Moreover, whilst not shown in FIG. 4a or 4b, two or more measurement periods in a sequence of measurement periods may overlap. Furthermore, the measurement periods may be of the same length/duration (for example, in FIG. 4b the measurements periods 408, 410 and 412 may be of a predetermined length), or the measurement periods may be of different lengths/durations (see, for example, the measurement periods 416, 418, 420 and 422 in FIG. 4b).

In general, then, a measurement period is a period of time over which measurements of utility consumption may be taken (for example, by the sensors 16). A measurement period may be considered as a period of time over which utility consumption values/measurements are to be obtained and/or analysed and/or considered as a group. A sequence of measurement periods may be used—the measurements periods in the sequence may or may not overlap, may or may not be of the same length, and may or may not be contiguous.

Within a given measurement period, one or more utility values representing a level of consumption of a utility may be taken (or measured or determined). For example, the input section 22 of the apparatus 20 may, during a measurement period, receive or obtain one or more utility values representing a total level of consumption of a utility by the group of appliances from a meter 16. These individual utility values may be instantaneous values, or they may be averaged over a given period (e.g. a short measurement window within the measurement period).

Figure 4C:
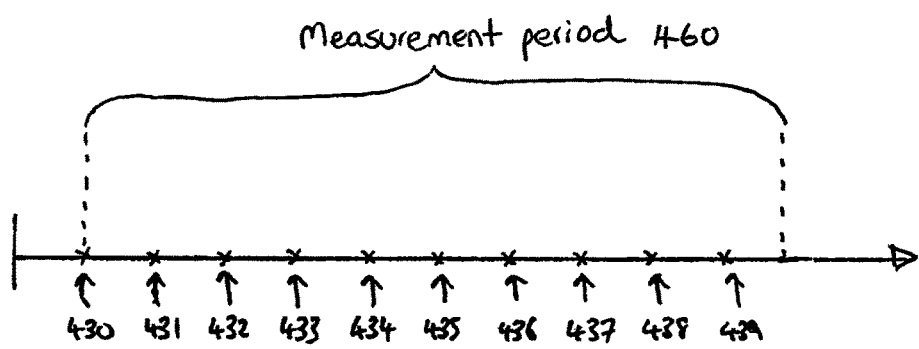
FIGS. 4c and 4d schematically illustrate example sequences of utility values for a measurement period.
Figure 4D:
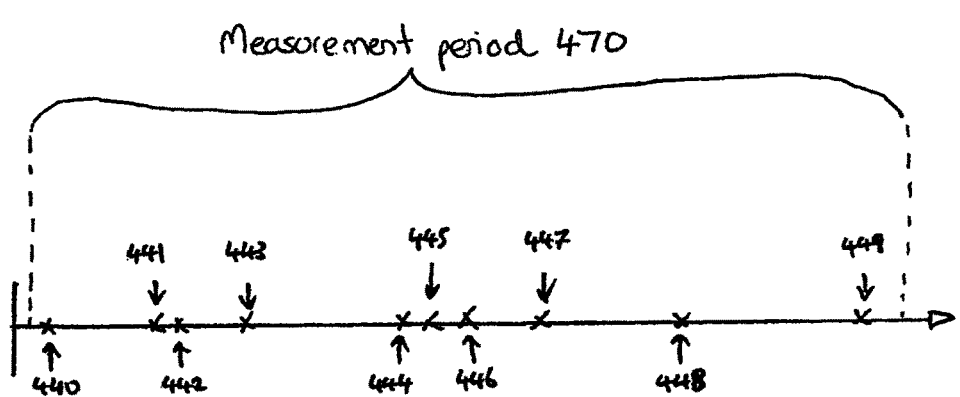

The one or more utility values for a measurement period may be obtained at any points in time during the measurement period (which may or may not include the start or end of the measurement period), thereby providing a sequence of one or more utility values for the measurement period. FIGS. 4c and 4d schematically illustrate example sequences of utility values for a measurement period. As illustrated in FIG. 4c, the utility values may be regularly spaced (in time)—see, for example, the utility values 430-439 during a measurement period 460. As illustrated in FIG. 4d, the utility values may be irregularly spaced (in time)—see, for example, the utility values 440-449 during a measurement period 470. At any point during the measurement period, a plurality of utility values corresponding to that point may be taken—for example, at a given point during the measurement period, corresponding measurements of electrical current and voltage levels could be taken; similarly, with a poly-phase electricity supply (such as a three-phase electricity supply), multiple measurements of current levels (corresponding to each of the phases) could be taken corresponding to that particular point in the measurement period.

The length of a measurement period may depend on the nature of the particular utility being considered. For example, when the utility is a 50 Hz electricity supply, then a measurement period may correspond to the length of one cycle in the supply, i.e. 0.02 seconds. As described above, the duration of the measurement period may be dependent on the length of a cycle in other ways.

As will be described in more detail later, embodiments of the invention operate based on each appliance 12 being in a "device-state". A device-state for an appliance 12 may correspond to the appliance 12 being in a configuration (or setting or mode) in which the appliance 12 consumes a utility 10 to perform a corresponding function (i.e. to carry out one or more actions, tasks or operations corresponding to that particular device-state). Alternatively, a device-state for an appliance 12 may correspond to the appliance 12 being in a configuration in which the appliance 12 is not consuming a utility 10 at all since the appliance 12 may be in an "off-state" (i.e. the appliance may be turned off, powered down or shut down) or the appliance 12 may be no longer in use or may be simply waiting to be switched on. When an appliance 12 is in a particular device-state, the utility consumption by that appliance 12 may assume a corresponding utility consumption profile.

An appliance 12 may be able to perform only one function. Such an appliance 12 may have only two device-states—a first device-state may correspond to the appliance 12 not consuming a utility 10 (that is, the appliance 12 may be switched off), and a second device-state may correspond to the appliance 12 consuming a utility 10 (that is, the appliance 10 may be switched on and performing its one function). For example, an electric clock may have a first device-state corresponding to the electric clock being switched off and not consuming electricity, and a second device-state corresponding to the electric clock being switched on and consuming electricity to display a time.

An appliance 12 may be able to perform multiple functions, however, the appliance 12 may only be capable of performing one function at a time. Such an appliance 12 may have more than two device-states a first device-state may correspond to the appliance 12 not consuming a utility 10 (that is, the appliance 12 may be switched off), and further device-states may correspond to the device consuming a utility 10 in different ways (that is, the appliance 12 may be switched on and performing one of its functions). For example, a television may have a first device-state corresponding to the television being switched off and not consuming electricity, a second device-state corresponding to the television being switched on and consuming electricity to display a television programme, and a third device-state corresponding to the television consuming electricity whilst being in a standby mode.

An appliance 12 may be able to perform multiple functions simultaneously. Such an appliance 12 may have more than two device-states a first device-state may correspond to the appliance 12 not consuming a utility 10 (that is, the appliance 12 may be switched off), and further device-states may correspond to the device consuming a utility 10 in different ways (that is, the appliance 12 may be switched on and performing one or more of its functions). For example, a washing machine has a pump and a motor and, at any given time, the pump may be either switched off or switched on and the motor may be either switched off or the motor may be switched on and operating in one of several speed settings (such as a low speed setting, a medium speed setting or a high speed setting). Each possible combination of states of the individual components of the appliance (i.e., the pump state and the motor state) may correspond to a device-state—for example, a first device-state may correspond to the pump being switched on and the motor being switched off, and a second device-state may correspond to the pump being switched on and the motor being switched to a low speed setting, etc.

A device-state may correspond to a particular function that the appliance 12 is performing. For example, the washing machine may have a device-state which corresponds to the washing machine performing a spin cycle. In the device-state which corresponds to the washing machine performing a spin cycle, the motor may be switched on and operating in a high speed setting, while the pump may be switched off. The washing machine may have other device-states which correspond to the washing machine performing other parts of the wash cycle, such as rinsing, or draining. Moreover, a device-state may correspond to a real state of an appliance 12 (as set out above) or a more abstract state of an appliance 12—for example, the heating operation performed by a kettle may be modelled or approximated by a discrete series of device-states that approximate the changing status of the kettle.

In an appliance 12 which comprises multiple components (such as the washing machine described above which has a pump and a motor, or any other appliance 12 which comprises multiple components) each individual component (for example, the pump and the motor) may be considered to be a separate device each with their own set of device-states which correspond to the possible functions/states of that component. For example, the washing machine above may consist of a first device which represents the pump and a second device which represents the motor—(a) the first device may have two device-states which represent possible states of the pump (the first device-state corresponds to the pump not consuming electricity, i.e., the pump may be switched off, and the second device-state corresponds to the pump consuming electricity to perform its pumping operation); (b) the second device may have four device-states which represent possible states of the motor (the first device-state may correspond to the motor being switched off and not consuming electricity, the second device-state may correspond to the motor being switched on and consuming electricity to operate in a low speed setting, the third device-state may correspond to the motor being switched on and consuming electricity to operate in a medium speed setting, and the fourth device-state may correspond to the motor being switched on and consuming electricity to operate in a high speed setting).

Hence, the term "device" is used herein to refer to an appliance 12, or a component of an appliance 12, which may have a plurality of device-states. For example, a washing machine may be considered to be a device in its own right, with numerous device-states based on the states of its component pump and motor; alternatively, the component pump and the motor may be considered to be separate devices with their respective device-states. Embodiments of the invention can be used with either perspective depending on the resolution required, for example, whether it is sufficient to know that the washing machine is consuming a certain quantity of electricity, or whether it is desirable to know information about the electricity consumption of the pump and the motor within the washing machine separately.

In the following, it shall be assumed that the site has Nd number of devices (be they appliances 12 and/or components of appliances 12 as set out above), the set or group of devices being device $D_1$, device $D_2$, . . . , device $D_{Nd}$. For $1 \leq i \leq Nd$, device $D_i$ has Nds(i) number of devices states, the set of device-states for the i-th device $D_i$ being device-state $DS_{i,1}$, device-state $DS_{i,2}, \ldots DS_{i,Nds(i)}$. It will be appreciated that, for a particular device $D_i$, there may in practice be more than $Nds(i)$ device-states for that device $D_i$ however, $Nds(i)$ represents the number of modelled or known devices states $D_i$, or at least the number of device-states that are going to be considered for the device $D_i$. For example, when a device transitions from one device-state to another device-state, there may be a transitional period during which utility consumption may be more difficult to model or may simply be of no interest such a transitional period may therefore not be modelled as a device-state.

Embodiments of the invention will consider a number Ngs of "group-states", the set or group of group-states being group-state $GS_1$, group-state $GS_2$, group-state $GS_{Ngs}$. For $1 \leq j \leq Ngs$, the j-th group-state $GS_j$, corresponds to each of the Nd devices being in a corresponding one of its device-states from its set of possible device-states. Thus, a group-state corresponds to the group of Nd devices being, collectively, in a corresponding configuration. Given that there are $Nds(i)$ number of device-states known for device $D_i$, the total number of known group-states is $$\prod_{i=1}^{Nd} Nds(i).$$

However, embodiments of the invention may not necessarily make use of all of these possible group-states, so that Ngs may be less than $$\prod_{i=1}^{Nd} Nds(i).$$

For example, certain theoretical group-states may be known to not occur or exist in practice—for example when a first device can only be turned on if a second device is turned off, then a group-state involving the first device being turned on and the second device being turned on too need not be considered as this cannot occur in practice. Moreover, certain group-states may not be of interest and may therefore not be used (e.g. if they are considered highly unlikely to occur)—this may then reduce the processing time required for embodiments of the invention.

The concept of group-states may be illustrated by way of the following example. A site 11 may have three devices (an electric clock, a television and a washing machine) where each of the three devices may, at any one time, be in a particular device-state. The possible devices states of the group of devices may be as follows.

The electric clock may be switched on and displaying a time, or the electric clock may be switched off.

The television may be switched off, or the television may be switched on and displaying a television programme, or the television may be in a standby mode.

The washing machine—which includes a pump (which may be switched on or switched off) and a motor (which may be either switched off, or switched on and operating in one of a number of speed settings, for example, a low speed setting, a medium speed setting or a high speed setting)—has a plurality of device-states, where each device-state corresponds to a particular combination of the states of the individual components (i.e., the pump state and the motor state).

Possible group-states of the above three devices correspond to particular combinations of the device-states of each device—for example, a first group-state may correspond to the electric clock being switched on, the television being in a standby mode and the washing machine performing a spin cycle; a second group-state may correspond to the electric clock being switched off, the television being switched on and displaying a programme, and the washing machine being switched off; and so on.

In the following the function q shall be used as follows: the function q takes as inputs the index j for the j-th group-state $GS_j$ and the index i for the i-th device $D_i$ and outputs the index k for the device-state $DS(i,k)$ that the i-th device $D_i$ assumes when the set of devices is in the j-th group-state $GS_j$, i.e. $q(j,i)=k$.

Embodiments of the invention operate by associating, or using, a respective multivariate statistical model (or a multivariate probabilistic model) with each of the Ngs group-states being considered. In the following, the multivariate statistical model corresponding to the j-th group-state $GS_j$ shall be represented by model $M_j$ (for $1 \leq j \leq Ngs$). The j-th model $M_j$ represents the probability distribution for a series (or sequence or vector) of a plurality of values, each representing the total level of consumption of a utility by the group of devices at a corresponding point in time during a measurement period, under the assumption that the group of devices is in the j-th group-state $GS_j$. In other words, during a measurement period, a time-based series $x=(x_1, x_2, \ldots, x_N)$ of measurements of the total level of consumption of the utility by the group of devices could be taken and the j-th model $M_j$ represents the likelihood of that series of values occurring if the group of Nd devices is in the j-th group-state $GS_j$. In other words, the j-th model can be used to determine or provide a likelihood (or probability) that, under the assumption that the group of devices is in the j-th group-state $GS_j$, a particular time-based series/vector of values representing total levels of consumption of a utility by the group of devices will occur during a measurement period. The model $M_j$ is a multivariate statistical model as it considers the probability distribution for a vector or time series of values, and each value may be considered to be a random variable in its own right.

In the above, N represents the length of the time-series vector (i.e. the number of values/measurements in the time-based vector), i.e. the number of random variables in the multivariate statistical model. In the following, it shall be assumed that all time-based vectors are of length N and that each of the N values in the time-based vector corresponds to a particular time-offset (or position) within an associated measurement period, so that two time-based vectors will be substantially synchronised (relative to their respective measurement periods). If, in practice, a time-based vector has a different number of values, then it may be easily converted to a time-based vector with N values by interpolation. In embodiments of the invention, a typical value for N may be 200 or substantially equal thereto.

The term "time-based vector" is intended to cover a strict time-series of values, so that a value in the time-based vector corresponds to a point in time that occurs after (or, alternatively, before) the value that precedes it in the time-based vector. For example, with a single-phase electricity supply, a time-based vector of current levels may be a sequence of current level values where each current level value was measured, or occurred, at a point in time later than any preceding current level values in the sequence. However, it will be appreciated that the term "time-based vector" is also intended to cover a sequence of values equivalent to a re-ordering of any such strict time-series of values (e.g. a reversal of order or some other shuffling of values). Moreover, the term "time-based vector" is also intended to cover scenarios in which a plurality of values in the vector occurred, or were measured, at the same point in time. For example, with a polyphase electricity supply, at a given point in time a plurality of corresponding current values may be measured (one for each of the phases of the polyphase electricity supply)—these plurality of current values (corresponding to the same point in time) may form part of the time-based vector. This could be achieved by concatenating a plurality of strict time-series of current values (there being a strict time-series for each of the phases); alternatively, this could be achieved by grouping together, within the time-based vector, the measurements taken at the same point in time; alternatively, some other ordering could be used. It will also be appreciated that the values in a time-based vector need not necessarily represent the same entity being measured (for example, in the polyphase electricity supply, measurements of different phases would be represented in the time-based vector) and that, indeed, different values in the time-based vector may have different units (for example, if the values in the time-based vector represent real power and reactive power measurements, or current and voltage measurements).

It will be appreciated that the model $M_j$ may be represented or determined in a number of ways, and that various data or characteristics of the model $M_j$ may be stored in the memory 28 accordingly. Whilst examples will be given below, it will be appreciated that embodiments of the invention are not limited to these examples or their methods of calculation and representation. It will also be appreciated that for two different group-states, the same or different model types may be used.

The model $M_j$ for a group-state $GS_j$ may involve (or use or comprise) a mean vector $\mu_{GS(j)}$ and a covariance matrix $C_{GS(j)}$, where (a) the mean vector $\mu_{GS(j)}$ represents a mean of a group of vectors $\{v_1, \ldots, v_R\}$, each being a time-based vector of total levels of consumption of the utility by the Nd devices when the Nd devices are in the group-state $GS_j$ during respective measurement periods; (b) the covariance matrix $C_{GS(j)}$ is a covariance matrix for this group of vectors $\{v_1, \ldots, v_R\}$. There are various ways in which the mean vector $\mu_{GS(j)}$ and the covariance matrix $C_{GS(j)}$ can be determined. For example, one can set the group of devices to be in the j-th group-state $GS_j$ and then, over a series of R measurement periods, obtain R corresponding time-based vectors $v_1, \ldots, v_R$ of total levels of consumption of the utility by the group of devices during the respective measurement period such time-based vectors could be obtained, for example, using the monitoring apparatus 20 or some similar apparatus. The mean vector $\mu_{GS(j)}$ and the covariance matrix $C_{GS(j)}$ can then be calculated from the R obtained time-based vectors $v_1, \ldots, v_R$.

However, as the number of group-states Ngs may be quite large, in a preferred embodiment, for each device ID; and each device-state $DS_{i,k}$ for that device, a mean vector $\mu_{DS(i,k)}$ and a covariance matrix $C_{DS(i,k)}$ may be determined and used. The mean vector $\mu_{DS(i,k)}$ represents a mean of a group of vectors $\{y_1, \ldots, y_S\}$, each being a time-based vector of levels of consumption of the utility by the i-th device $D_i$ when the device $D_i$ is in its k-th device-state $DS_{i,k}$ during a respective measurement period; (b) the covariance matrix $C_{DS(i,k)}$ is a covariance matrix for this group of vectors $\{y_1, \ldots, y_S\}$. There are various ways in which the mean vector $\mu_{DS(i,k)}$ and the covariance matrix $C_{DS(i,k)}$ can be determined, such as obtaining S corresponding time-based vectors $y_1, \ldots, y_S$ of levels of consumption of the utility by the device $D_i$ by (a) having the other devices in a known (steady) state (e.g. turned off) and then setting the device $D_i$ to be in its k-th device-state $DS_{i,k}$ and using the monitoring apparatus 20 or some similar apparatus or (b) by using a monitoring apparatus that takes measurements on the individual utility supply to the individual device $D_i$ when the device $D_i$ is in its k-th device-state $DS_{i,k}$ (e.g. taking measurements based on the particular wiring or pipe supplying the individual device $D_i$). The mean vector $\mu_{DS(i,k)}$ and the covariance matrix $C_{DS(i,k)}$ can then be calculated from the S obtained time-based vectors $y_1, \ldots, y_S$. Alternatively, the mean vector $\mu_{DS(i,k)}$ and/or the covariance matrix $C_{DS(i,k)}$ may be information that the manufacturer of the device $D_i$ can supply. In any case, having obtained a mean vector $\mu_{DS(i,k)}$ and a covariance matrix $C_{DS(i,k)}$ for each device and their associated device-states, the mean vector $\mu_{GS(j)}$ for the j-th group-state may be calculated as the sum of the mean vectors $\mu_{DS(i,k)}$ for the Nd devices in the device-states corresponding to the j-th group-state; similarly, the covariance matrix $C_{GS(j)}$ for the j-th group-state may be calculated as the sum of the covariance matrices $C_{DS(i,k)}$ for the Nd devices in the device-states corresponding to the j-th group-state. For example, if the $1^{st}$ group-state $GS_1$ corresponds to each of the Nd devices being in their first respective device-states $DS_{i,1}$, then $$\mu_{GS(1)} = \sum_{i=1}^{Nd} \mu_{DS(i,1)}$$

and $$C_{GS(1)} = \sum_{i=1}^{Nd} C_{DS(i,1)}.$$

Or, in general, $$\mu_{GS(j)} = \sum_{i=1}^{Nd} \mu_{DS(i,q(j,i))}$$

and $$C_{GS(j)} = \sum_{i=1}^{Nd} C_{DS(i,q(j,i))}.$$

This works particularly well under the assumption that the device-states for different devices are uncorrelated. Using this method also reduces the number of measurements that need taking in particular, $$\sum_{i=1}^{Nd} Nds(i)$$

sets of measurements need to be taken (i.e. one for each possible device-state) with this method, whereas the former method mentioned above would need to take Ngs sets of measurements, which may be $$\prod_{i=1}^{Nd} Nds(i)$$

sets of measurements.

The model $M_j$ for the group-state GS) may therefore be considered to comprise (or use or involve) the mean vectors $\mu_{DS(i,q(j,i))}$ and covariance matrices $C_{DS(i,q(j,i))}$ for each device in their device-states associated with the group-state $GS_j$.

It is possible that the covariance matrices $C_{GS(j)}$ may be ill-conditioned. Therefore, the model IA for the j-th group-state $GS_j$ may make use of a regularized covariance matrix. In particular, the covariance matrix $C_{GS(j)}$ may be replaced by a covariance matrix $C'_{GS(j)} = C_{GS(j)} + \varepsilon I$, where $\varepsilon$ is a regularization parameter and I is the identity matrix. The regularization parameters may be a small real number. In the following, reference to the covariance matrix $C_{GS(j)}$ shall mean the regularized covariance matrix $C'_{GS(j)}$ if regularization has been carried out. Similarly, the covariance matrices $C_{DS(i,k)}$ for individual devices $D_i$ and their device-states $DS_{i,k}$ may be ill-conditioned and may therefore be regularized in a similar way.

The regularization parameter s may be a predetermined value.

However, in preferred embodiments, the regularization parameters is chosen so as to ensure that the "condition number" of each of the regularized covariance matrices of the group-states $C'_{GS(j)}$ (1≤j≤Ngs) does not exceed a predetermined threshold value W (such as 100). Here, the term "condition number" of a matrix means the ratio of the largest eigenvalue of that matrix to the smallest eigenvalue of that matrix. A high condition number represents an ill-conditioned matrix, which is undesirable. Hence, it would be desirable to ensure that none of the covariance matrices of the group-states $C'_{GS(j)}$ (1≤j≤Ngs) has a condition number exceeding the predetermined threshold value W.

The number of group-states Ngs is exponentially related to the number of devices Nd. To avoid the processing involved in determining a suitable (in the sense set out above) regularization parameter E from also being exponential in the number of devices Nd, the following processing may be performed. For each device $D_i$ (1≤i≤Nd), the covariance matrix $C_{DS(i,k)}$ of each of the Nds(i) device-states $DS_{i,k}$ (1≤i≤Nd and 1≤k≤Nds(i)) may be analysed to determine the highest (or largest) eigenvalue of that covariance matrix $C_{DS(i,k)}$ (referred to below as $\lambda\_max(i,k)$)—it will be appreciated that there are many ways known to the skilled person for determining eigenvalues of a matrix. For each device $D_i$ (1≤i≤Nd), the highest of these determined highest eigenvalues $\lambda\_max(i,k)$ (1≤k≤Nds(i)) may be determined—this highest eigenvalue for the device $D_i$ shall be referred to below as $\lambda\_max(i)$. Let the value G be the sum of these highest eigenvalues over the various devices $D_i$, i.e.

$$G = \sum_{i=1}^{Nd} \lambda\_max(i).$$

The value G corresponds to the worst-case highest eigenvalue for any of the (non-regularized) covariance matrices for the group-states. The worst-case lowest eigenvalue for any of the (non-regularized) covariance matrices the group-states is 0 (as these matrices are symmetric semi-positive definite matrices). Adding $\varepsilon I$ to the covariance matrices of the group-states will give a new worst-case lowest eigenvalue of s. Adding $\varepsilon I$ to the covariance matrices of the group-states will give a new worst-case highest eigenvalue of G+$\varepsilon$. The highest possible condition number of any of the regularized covariance matrices of the group-states $C'_{GS(j)}$ (1≤j≤Ngs) would therefore be $$c = \frac{G + \varepsilon}{\varepsilon}.$$

Under the desire to have this condition number be at most the threshold value W, the regularization parameter can be set to be $$\varepsilon = \frac{G}{W - 1}$$

(at least).

In some embodiments, the covariance matrix $C_{GS(j)}$ for the j-th model $M_j$ may be truncated. This reduces the processing required when performing matrix multiplication calculations. Such truncation may be performed as follows. The covariance matrix $C_{GS(j)}$ may, according to the spectral theorem, be represented as $C_{GS(j)} = U \Lambda U^T$ where U is the unitary matrix containing the eigenvectors of $C_{GS(j)}$ and the matrix $\Lambda$ is a diagonal matrix where the terms on the diagonal are the eigenvalues of $C_{GS(j)}$. The skilled person will know how to obtain such a decomposition. In the truncation process, the diagonal matrix $\Lambda$ may be replaced with a diagonal matrix $\Lambda'$. This may be performed, for example, by taking the eigenvalues within a predetermined range (for example, a small percentage of $\varepsilon$ where $\varepsilon$ may be the above-mentioned regularization parameter if regularization has been performed, or a small range around 0 if regularization has not been performed) and setting them in $\Lambda$ to be equal to $\varepsilon$ (if regularization has been performed) or to 0 (if regularization has not been performed) to thereby obtain $\Lambda'$. The truncated covariance matrix is then $C''_{GS(j)} = U \Lambda' U^T$. In the following, reference to the covariance matrix $C_{GS(j)}$ shall mean the regularized and/or truncated covariance matrices $C'_{GS(j)}$ and $C''_{GS(j)}$ if regularization and/or truncation has been carried out. Similarly, the covariance matrices $C_{DS(i,k)}$ for individual devices $D_i$ and their device-states $DS_{i,k}$ may be truncated in a similar way.

Moreover, in some embodiments, the model $M_j$ for the j-th group-state $GS_j$ may make use of the inverse of the covariance matrix $C_{GS(j)}$. The inverse $C^{-1}_{GS(j)}$ may be regularized and/or truncated in an analogous manner as set out above. Similarly, some of the processing may make use of the inverse of the covariance matrices $C_{DS(i,k)}$ for individual devices $D_i$ and their device-states $DS_{i,k}$. The inverse $C^{-1}_{DS(i,k)}$ may be regularized and/or truncated, as set out above.

The skilled person will be familiar with the concept of regularization to handle ill-conditioned and/or sparse data, as well as the concept of truncation to improve computation efficiency when matrices are sparse, and hence further details shall not be set out herein.

In some embodiments of the invention, the model IA for a group-state $GS_j$ may be based on a multivariate Gaussian model, representable by the probability density function f(x), where $$f(x) = \frac{1}{(2\pi)^{N/2}|C_{GS(j)}|^{1/2}} e^{-\frac{1}{2}(x-\mu_{GS(j)})^T C_{GS(j)}^{-1}(x-\mu_{GS(j)})}$$

and where x represents a time-based vector of total levels of consumption of the utility by the group of devices during a measurement period, N is the length of the mean vector $\mu_{GS(j)}$ and of the obtained time-based vector, and $|C_{GS(j)}|$ represents the determinant of the matrix $C_{GS(j)}$. However, it will be appreciated that other multivariate statistical models may be used instead, such as ones based on a multivariate exponential model, a multivariate gamma model, a multivariate Poisson model, a multivariate Cauchy-Lorentz model, or on some other multivariate statistical model.

Figure 5:
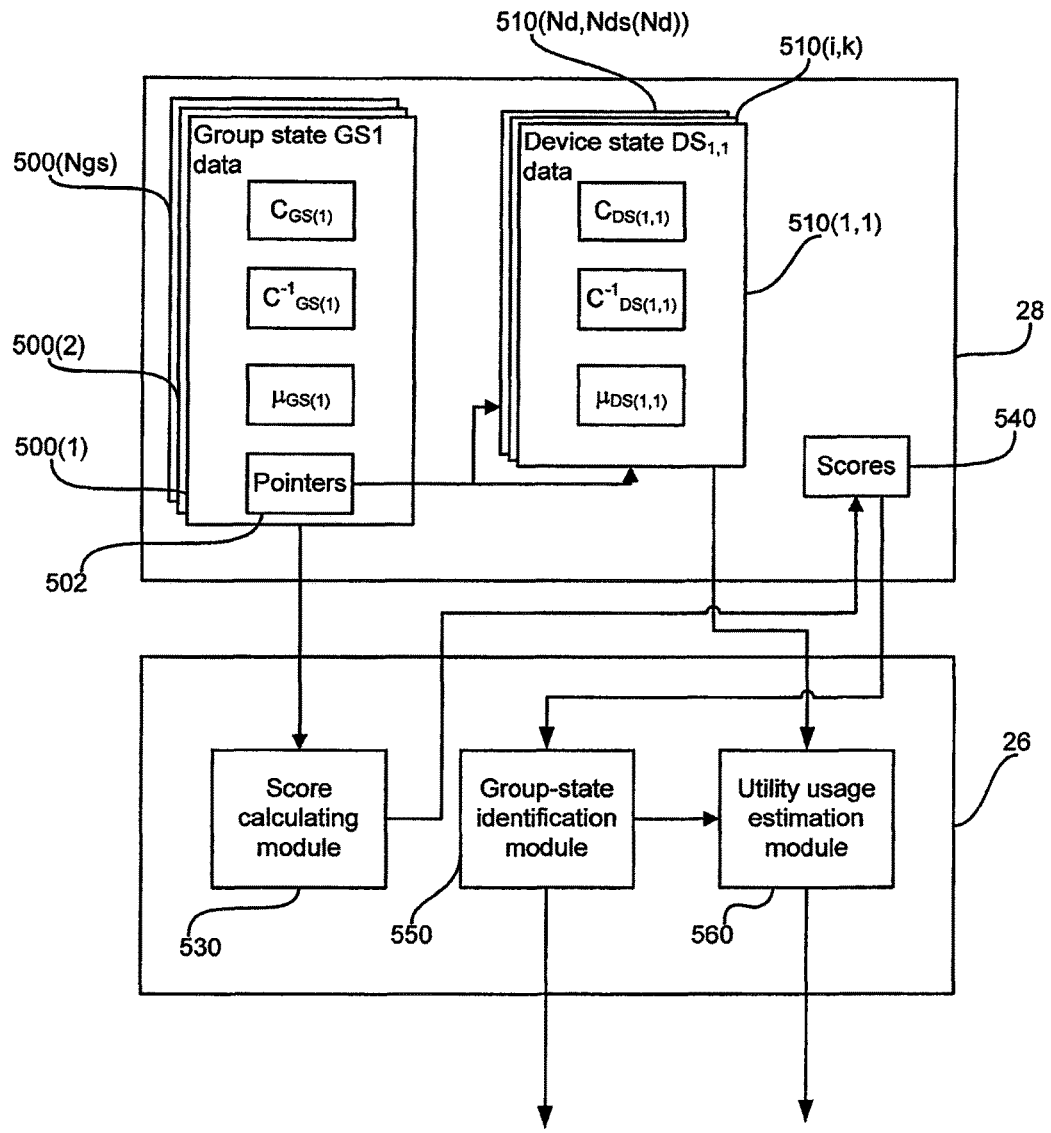
FIG. 5 schematically illustrates a processor and a memory of a monitoring apparatus according to an embodiment of the invention.

FIG. 5 schematically illustrates more detail of the processor 26 and the memory 28 of the monitoring apparatus 20 according to an embodiment of the invention.

As illustrated the memory 28 may store, for each of the group-states $GS_j$ (1≤j≤Ngs), group-state data 500(j). The group-state data 500(j) may comprise data representing the covariance matrix $C_{GS(j)}$ for the group-state $GS_j$, the inverse covariance matrix $C^{-1}_{GS(j)}$ for the group-state $GS_j$, and the mean vector $\mu_{GS(j)}$ for the group-state $GS_j$.

As illustrated the memory 28 may store, for each of the devices $D_i$ (1≤i≤Nd) and each of the Nds(i) respective device-states for the devices, device-state data 510(i,k). The device-state data 510(i,k) may comprise data representing the covariance matrix $C_{DS(i,k)}$ for the device-state $DS_{i,k}$, the inverse covariance matrix $C^{-1}_{DS(i,k)}$ for the device-state $DS_{i,k}$, and the mean vector $\mu_{DS(i,k)}$ for the device-state $DS_{i,k}$.

The group-state data 500(j) for a group-state $GS_j$ may comprise one or more pointers 502 that reference the device-state data 510(i,q(j,i)) associated with the devices being in the device-states corresponding to the group-state $GS_j$.

It will be appreciated that the memory 28 need not necessarily store all of this data. For example, the inverse of a covariance matrix may be calculated from the covariance matrix itself, and so the inverse of a covariance matrix need not necessarily be stored in the memory 28—the processor 26 could calculate the inverse as and when required. Similarly, as it is possible to calculate the covariance matrix $C_{GS(j)}$ for the group-state $GS_j$ and the mean vector $\mu_{GS(j)}$ for the group-state $GS_j$ from mean vectors and covariance matrices for corresponding device-states (as set out above), the memory 28 need not necessarily store the covariance matrix $C_{GS(j)}$ for the group-state $GS_j$ and the mean vector $\mu_{GS(j)}$ for the group-state $GS_j$—the processor 26 could calculate the group-state's mean vector $\mu_{GS(j)}$ and covariance matrix $C_{GS(j)}$ as and when required.

As will be described in more detail shortly, the processor 26 may comprise (or may be arranged to execute) a score calculating module 530 which uses the group-state data 500 to generate scores 540 that are stored in the memory 28. The processor 26 may comprise (or may be arranged to execute) a group-state identification module 550 which uses the scores 540 to identify, or estimate, a current group-state for the group of devices. The processor 26 may also comprise (or may be arranged to execute) a utility usage estimate module 560, the purpose of which shall be described later.

Figure 6:
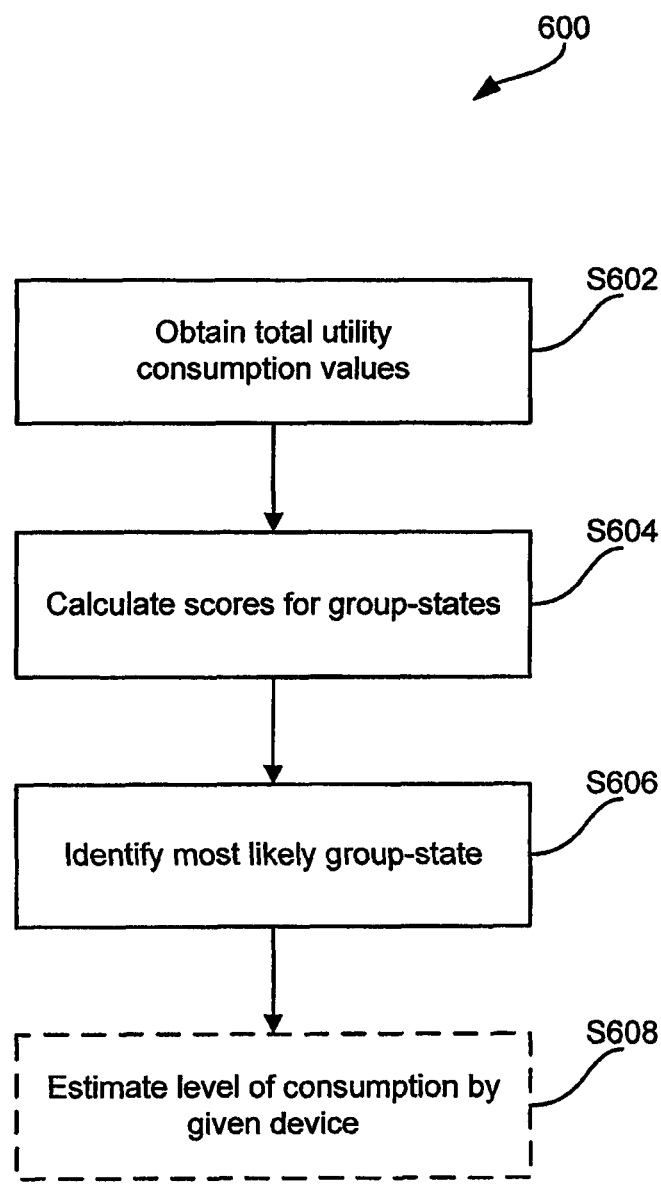
FIG. 6 is a flowchart illustrating a method of identifying consumption of a utility by devices a group of devices according to an embodiment of the invention.

FIG. 6 is a flowchart illustrating a method 600 of identifying consumption of a utility by devices in the group of devices according to an embodiment of the invention. The method 600 is carried out in respect of a current/given measurement period and may be repeated for one or more subsequent measurement periods. Examples of measurement periods, and sequences thereof, have been described above with reference to FIGS. 4a and 4b.

At a step S602, the processor 26 obtains a time-based vector $x=(x_1, \ldots, x_N)$ of values representing total levels of consumption of the utility by the group of devices during the current measurement period. Examples of time-based vectors of measurement values during a measurement period have been described above with reference to FIGS. 4c and 4d. As has been described above, the processor 26 may obtain the time-based vector x from a meter 16 via the input section 22, and the clock 24 may be used to determine the time at which each of the values $x_i$ is obtained/read.

At a step S604, the processor 26 uses the score calculating module 530 to generate, for each of the Ngs group-states being considered, a corresponding score. In particular, for each group-state $GS_j$ (1≤j≤Ngs), the score calculating module 530 calculates a corresponding score $S_j$ which the processor 26 stores in the memory 28 as score data 540.

The score $S_j$ for the j-th group-state $GS_j$ represents a likelihood that the group of Nd devices is in the group-state $GS_j$ during the current (given) measurement period. The score calculating module 530 calculates the score $S_j$ based on a likelihood of the obtained time-based vector $x=(x_1, \ldots, x_N)$ occurring, this likelihood being based on (or derived from) the model $M_j$ for the j-th group-state $GS_j$. The score $S_j$ may, for example, be the probability (or a function of the probability) that the model $M_j$ provides for the time-based vector $x=(x_1, \ldots, x_N)$ occurring when the group of devices is configured to be in the j-th group-state $GS_j$. Consequently, the score calculating module 530 may use the group-state data 500 (and possibly the device-state data 510) stored in the memory 28 to calculate the scores 540.

In one embodiment, particularly suited to embodiments in which the model $M_j$ is the above-mentioned multivariate Gaussian model, the score $S_j$ is calculated based on (or equal to) the value $\alpha(x-\mu_{GS(j)})^T C_{GS(j)}^{-1}(x-\mu_{GS(j)}) + \beta \ln(|C_{GS(j)}|) + \gamma$ wherein $\alpha$, $\beta$ and $\gamma$ are constants. In one embodiment, $\alpha = \beta = \frac{1}{2}$ and $$\gamma = \frac{N}{2}\ln(2\pi)$$

so that $$S_j = \frac{1}{2}(x-\mu_{GS(j)})^T C_{GS(j)}^{-1}(x-\mu_{GS(j)}) + \frac{1}{2}\ln(|C_{GS(j)}|) + \frac{N}{2}\ln(2\pi),$$

in which case $S_j = -\ln(f(x))$, where f(x) is the above-mentioned probability density function for the Gaussian multivariate statistical model (alternatively, to avoid division by 2, one could set $\alpha=\beta=1$ and $\gamma=N \ln(2\pi)$ so that $S_j = (x-\mu_{GS(j)})^T C_{GS(j)}^{-1}(x-\mu_{GS(j)}) + \ln(|C_{GS}|) + \ln(2\pi)$, in which case $S_j = -2 \ln(f(x))$, where f(x) is the above-mentioned probability density function for the Gaussian multivariate statistical model). For this particular embodiment, the lower the score, the higher the likelihood of the group of devices being in the j-th group-state $GS_j$. The group-state data 500(j) for the group-state $GS_j$ may also comprise data representing the values $$\frac{1}{2}\ln(|C_{GS(j)}|)$$

and $$\frac{N}{2}\ln(2\pi)$$

so that these values do not need to be re-computed each time a score is generated.

It will be appreciated that, for different model types (such as the ones mentioned above), the formula for calculating a suitable score value $S_j$ will depend on the particular model being used. For example, it is possible that one could simply set the score $S_j$ to be f(x), where f is the probability density function for the model $M_j$—in this case, the higher the score, the higher the likelihood of the group of devices being in the j-th group-state $GS_j$. For models $M_j$ whose probability density function involves an exponential, such as the above-mentioned probability density function for the Gaussian multivariate statistical model, the score $S_j$ could be based on a logarithm of the probability density function (as mentioned above)—this helps reduce the complexity of calculating the scores.

At a step S606, the processor 26 uses the group-state identification module 550 to identify, based at least in part on the calculated scores 540, a most likely group-state for the group of devices, i.e. an estimate of the current group-state for the group of devices for the current measurement period. In particular, the group-state identification module 550 may identify the score $S_j$ that represents the highest likelihood that the group of Nd devices is in the corresponding group-state $GS_j$ during the current (given) measurement period, and may therefore identify that the group of devices is currently configured in the corresponding group-state $GS_j$.

However, at the step S606, the group-state identification module 550 may identify that the group of devices is not in any of the Ngs group-states $GS_1, \ldots, GS_{Ngs}$ that have been tested, in which case the group-state identification module 550 identifies that the most likely group-state for the group of devices is a group-state other than one of the Ngs group-states considered. This could occur, for example, if one or more of the devices is transitioning from one device-state to another device-state so that the current utility consumption by those one or more devices does not conform to the particular utility consumption profile for any of the group-states considered. The group-state identification module 550 may make such a determination (namely that the group of devices is not in any of the Ngs group-states $GS_1, \ldots, GS_{Ngs}$ that have been tested) based on a function of the scores $S_1, \ldots, S_{Ngs}$ that have been calculated. In particular, assuming that the lower the score $S_j$ the lower the determined likelihood that the group of devices is in the j-th group-state $GS_j$, then (a) the group-state identification module 550 may make such a determination by comparing the sum of the scores $$\left(\sum_{j=1}^{Ngs} S_j\right)$$

with a predetermined threshold and, if this sum is less than the predetermined threshold, then the group-state identification module 550 may determine that the most likely group-state for the group of devices is not any of the Ngs group-states $GS_1, \ldots, GS_{Ngs}$ that have been tested; or (b) the group-state identification module 550 may make such a determination by comparing each of the scores $S_j$ with a predetermined threshold and, if they are all less than the predetermined threshold, then the group-state identification module 550 may determine that the most likely group-state for the group of devices is not any of the Ngs group-states $GS_1, \ldots, GS_{Ngs}$ that have been tested. Similarly, assuming that the lower the score $S_j$ the higher the determined likelihood that the group of devices is in the j-th group-state $GS_j$, then (a) the group-state identification module 550 may make such a determination by comparing the sum of the scores $$\left(\sum_{j=1}^{Ngs} S_j\right)$$

with a predetermined threshold and, if this sum is greater than the predetermined threshold, then the group-state identification module 550 may determine that the most likely group-state for the group of devices is not any of the Ngs group-states $GS_1, \ldots, GS_{Ngs}$ that have been tested; or (b) the group-state identification module 550 may make such a determination by comparing each of the scores $S_j$ with a predetermined threshold and, if they are all greater than the predetermined threshold, then the group-state identification module 550 may determine that the most likely group-state for the group of devices is not any of the Ngs group-states $GS_1, \ldots, GS_{Ngs}$ that have been tested. It will be appreciated that other methods may be used and that embodiments of the invention may determined that the most likely group-state for the group of devices is not one of the plurality of Ngs group-states tested based on a comparison of the calculated scores 540, or a function of the calculated scores 540, with a predetermined threshold.

Figure 1:
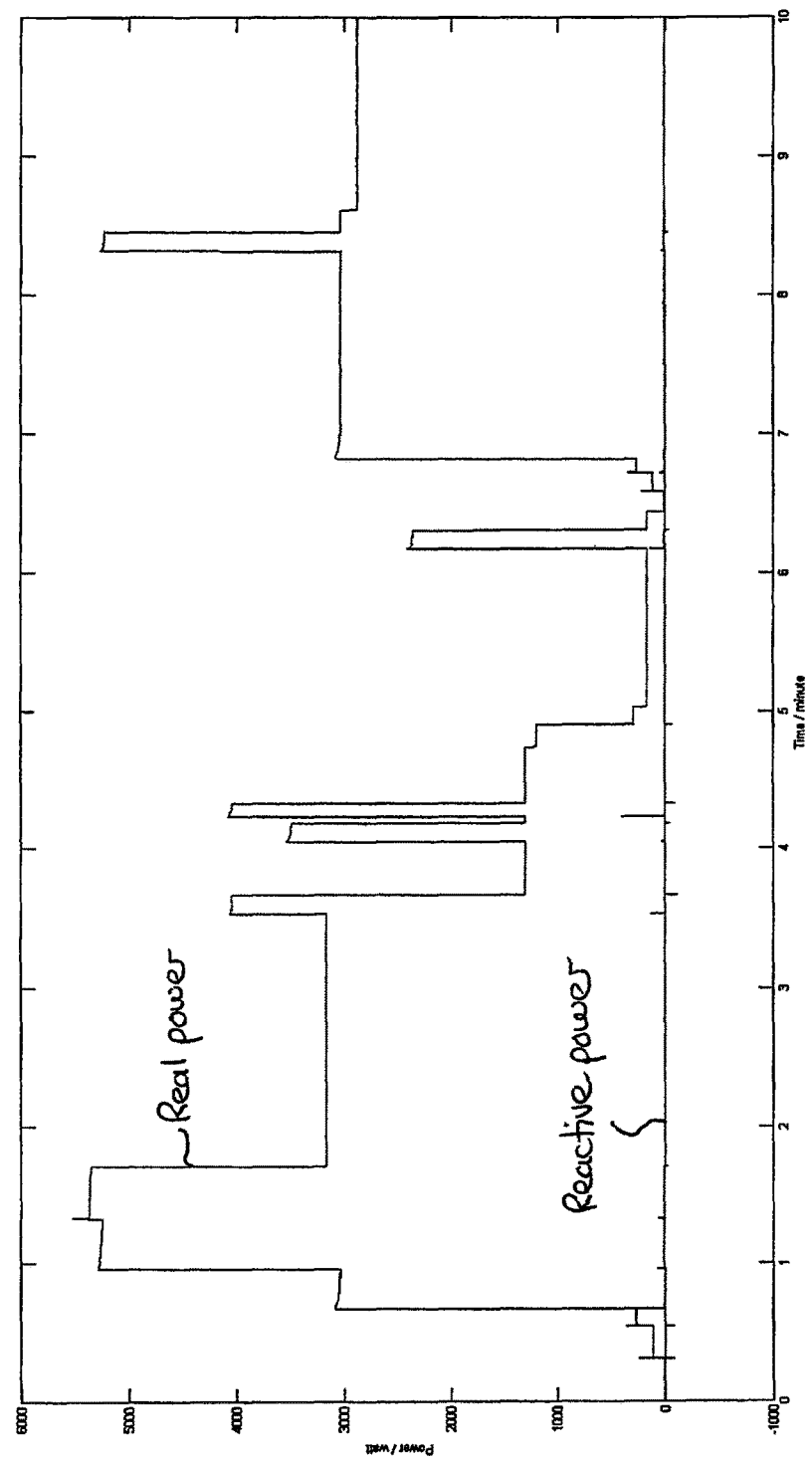
FIG. 1 shows a typical utility consumption profile for a domestic site.
Figure 2:
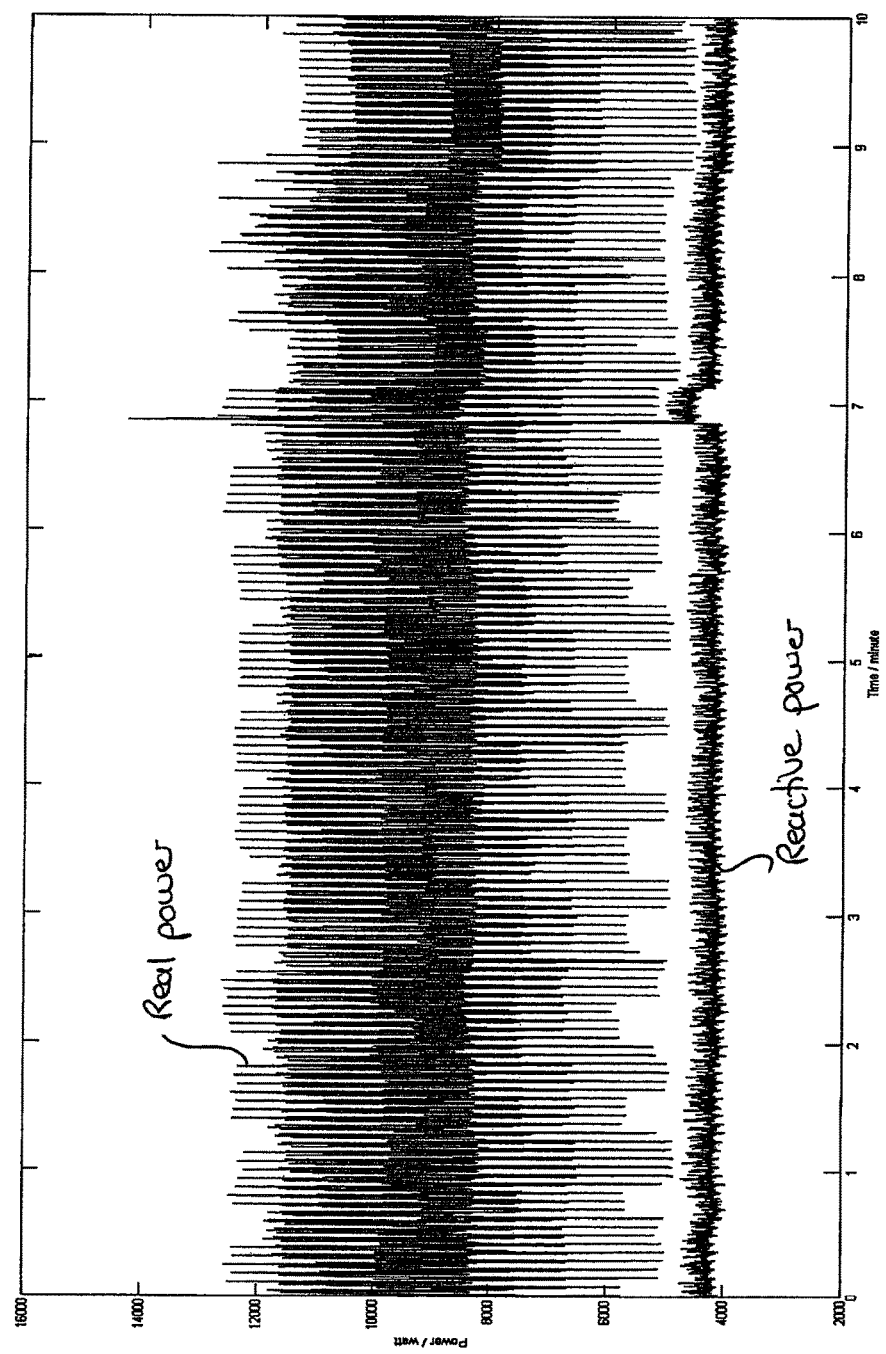
FIG. 2 shows a utility consumption profile which has been recorded at a factory.

Thus, embodiments of the invention make use of the models $M_j$ to identify a most likely group-state for the group of devices. This provides much more accurate and reliable estimates of the current configuration for a group of devices than previously known methods, especially in highly dynamic environments where utility usage levels change rapidly (as illustrated in FIG. 2).

Transitions

In some embodiments, the group-state identification module 550 may make its determination of the most likely group-state based (at least in part) on information corresponding to one or more preceding measurement periods, e.g. based on one or more earlier time-based vectors of total levels of consumption of the utility by the group of devices during one or more preceding measurement periods, or based on the most likely group-states identified for those one or more preceding measurement periods. This may be achieved, for example, by making use of a hidden Markov model for the most likely group-state for the group of devices it will be appreciated that the skilled person would know how to implement a hidden Markov model (or similar).

For example, for each of the devices $D_i$ (1≤i≤Nd), an associated transition matrix $TD_i$ may be determined. The transition matrix $TD_i$ is a Nds(i)×Nds(i) matrix, where the (a,b)-th element of the transition matrix $TD_i$ represents a probability or a likelihood that device $D_i$, when in device-state $DS_{i,a}$, will transition to being in device-state $DS_{i,b}$ at the next measurement period. The diagonal entries of the transition matrix $TD_i$ represent the respective likelihoods or probabilities that the device $D_i$ will stay in its current device-state at the next measurement period. It will be appreciated that other representations of a transition matrix are possible (e.g. using the transpose $TD_i^T$ of the above-described matrix $TD_i$).

There are many ways in which the transition matrix $TD_i$ for device $D_i$ may be set or estimated. For example, one could monitor the operation of the device $D_i$ over a number (preferably a statistically large/significant number) of measurement periods and, for each measurement period, determine in which device-state, out of the Nds(i) device-states for device $D_i$, the device $D_i$ is operating. This can be achieved in a number of ways, such as (a) by observing the device $D_i$ (e.g. it is possible to observe whether a washing machine's pump or motor is operating) or (b) by using the mean vectors $\mu_{DS}(i,k)$ and covariance matrices $C_{DS(i,k)}$ to determine, for each possible device-state $DS_{i,k}$ ($1 \leq k \leq Nds(i)$) a score indicating the likelihood that the device $D_i$ is in that device-state (e.g. in a similar manner to using a score function as set out above for determining when the group of devices is a particular group-state based on the mean vectors $\mu_{GS(j)}$ and covariance matrices $C_{GS(j)}$), and, based on these scores, choose the most likely device-state for the current measurement period (in a similar manner as set out above). Then, if the number of measurement periods during which the device $D_i$ was in device-state $DS_{i,a}$ was $n_a$ and, out of those $n_a$ measurement periods, there were $n_b$ measurement periods when the device $D_i$ was in device-state $DS_{i,b}$ in the subsequent measurement period, then one could set the (a-b)-th element of transition matrix $TD_i$ to be $n_b/n_a$.

Alternatively, one could again monitor the operation of the device $D_i$ over a number (preferably a statistically large/significant number) of measurement periods and, for each measurement period, determine in which device-state, out of the Nds(i) device-states for device $D_i$, the device $D_i$ is operating (this could be achieved as set out above). For each of the Nds(i) device-states for device $D_i$, one can work out the mean duration $\gamma$ that the device $D_i$ operated continually in that device-state (i.e. a mean number of consecutive measurement periods). For example, if the monitoring indicated that the device $D_i$ operated in device-state $DS_{i,a}$ on 5 occasions for only 1 measurement period, on 8 occasions for 2 consecutive measurement periods, on 4 occasions for 3 consecutive measurement periods, on 2 occasions for 4 consecutive measurement periods, and on no occasions for a longer continuous duration, then the mean duration for device $D_i$ to operate continually in device-state $DS_{i,a}$ is $\gamma_{i,a} = (5 \times 1 + 8 \times 2 + 4 \times 3 + 2 \times 4)/(5+8+4+2) = 2.16$ measurement periods. More generally, if the monitoring indicated that the device $D_i$ operated in device-state $DS_{i,a}$ for a duration of k consecutive measurement periods on $t_{i,a,k}$ occasions (k=1, 2, ...), then the mean duration is $$\gamma_{i,a} = \frac{\sum_k t_{i,a,k} k}{\sum_k t_{i,a,k}}.$$

The probability that device $D_i$, once in device-state $DS_{i,a}$, remains in that device-state $DS_{i,a}$ is then $$\tau_{i,a} = 1 - \frac{1}{\gamma_{i,a}}.$$

This is due to the following:

$P(D_i$, once in $DS_{i,a}$, will be in $DS_{i,a}$ for n consecutive measurement periods$) = \tau_{i,a}^{n-1}(1 - \tau_{i,a})$ $$\gamma_{i,a} = E(n) = \sum_{n=1}^{\infty} \tau_{i,a}^{n-1}(1 - \tau_{i,a})n = (1 - \tau_{i,a})\sum_{n=1}^{\infty} \tau_{i,a}^{n-1} n$$

$$= (1 - \tau_{i,a})\sum_{n=1}^{\infty} \frac{d}{d\tau_{i,a}} \tau_{i,a}^n = (1 - \tau_{i,a})\frac{d}{d\tau_{i,a}} \sum_{n=1}^{\infty} \tau_{i,a}^n$$

$$= (1 - \tau_{i,a})\frac{d}{d\tau_{i,a}}\left(\frac{\tau_{i,a}}{1 - \tau_{i,a}}\right) = \frac{1}{1 - \tau_{i,a}}$$

so that $$\tau_{i,a} = 1 - \frac{1}{\gamma_{i,a}}.$$

One can then set the diagonal entries of $TD_i$ to be these calculated probabilities, i.e. the (a,a)-th element of $TD_i$ is $\tau_{i,a}$. The non-diagonal entries of $TD_i$ can then be set as follows. In particular, one can assume that, for device $D_i$ and a device-state $DS_{i,a}$ ($1 \leq a \leq Nds(i)$), the probability p of transitioning from that device-state $DS_{i,a}$ to any other device-state $DS_{i,b}$ ($b \neq a$) of device $D_i$ is the same for each $b \neq a$, with $1 \leq b \leq Nds(i)$. As the transition probabilities based on currently being in device-state $DS_{i,a}$ will sum to 1, this probability p will be $$\frac{1 - \tau_{i,a}}{Nds(i) - 1},$$

and thus one can set the (a,b)-th elements of $TD_i$ to be $$\frac{1 - \tau_{i,a}}{Nds(i) - 1}$$

(for $1 \leq b \leq Nds(i)$ and $b \neq a$). It will be appreciated that other methods for setting the non-diagonal elements of $TD_i$ could be used.

Alternatively, the transition matrices can be determined by more automated techniques, such as by using Variational Bayesian Learning—see, for example, "Ensemble Learning for Hidden Markov Models", D J C Mackay, 1997, the entire disclosure of which is incorporated herein by reference.

For the group of devices $D_i$ ($1 \leq i \leq Nd$), a group transition matrix TG may be determined. The group transition matrix TG is a Ngs×Ngs matrix, where the (a,b)-th element of the group transition matrix TG represents a probability or a likelihood that the group of devices, when in group-state $GS_a$, will transition to being in group-state $GS_b$ at the next measurement period. The diagonal entries of the group transition matrix TG represent the respective likelihoods or probabilities that the group of devices will stay in its current group-state at the next measurement period. It will be appreciated that other representations of a transition matrix are possible (e.g. using the transpose $TG^T$ of the above-described matrix TG).

The group transition matrix TG may be determined from the transition matrices $TD_i$ for the devices $D_i$ ($1 \leq i \leq Nd$). In particular, under the assumption that the device-state transitions that a first device $D_j$ undergoes are independent from the device-state transitions that a second device $D_k$ undergoes (for $1 \leq j$, $k \leq Nd$, $j \neq k$), then the (a,b)-th element of TG is $$\prod_{i=1}^{Nd} ((q(a, i),$$

q(b,i))-th element of $TD_i$).

Alternatively, the group transition matrix TG could be determined in a manner similar to those described above for determining the devices' transition matrices $TD_j$.

The group-state identification module 550 and/or the score calculating module 530 may make use of the group transition matrix TG to help determine the most likely group-state for the group of devices. For example, if the group-state that was most recently determined for the group of devices was $GS_a$ (i.e. the group of devices was determined to be in the group-state $GS_a$ at the preceding measurement period), then the score calculating module 530 may determine the scores $S_j$ for each group-state ($1 \leq j \leq Ngs$) as set out above, but then adjust those scores $S_j$, to form respective adjusted scores $S_j'$, where $S_j'=S_j \times$(a,j)-th element of TG. The group-state identification module 550 could perform these adjustments instead of the score calculating module 530. In this way, the score for a group-state $GS_j$ may be weighted according to the likelihood that the group of devices would have transitioned from being in the previous group-state $GS_a$ to that group-state $GS_j$. The group-state identification module 550 would then determine the most likely group-state based on the adjusted scores $S_j'$. It will be appreciated that whilst the above has been described with reference to looking back at a single preceding group-state, it is possible to look back at multiple preceding group-states and perform score adjustments/weighting analogously taking account of those multiple preceding group-states.

Additionally or alternatively, given the group-states $GS_j$ ($j=1, \ldots, Ngs$) and their respective multivariate statistical models and given a sequence of observations (i.e. a sequence of vectors x(t) of total levels of consumption of the utility by the group of devices during respective measurement periods, each vector x(t) being obtained at a respective execution of the step S602), the score calculation module 530 may calculate, for each group-state using the multivariate statistical model for that group-state, a score indicating a likelihood that each observation occurred if the group of devices were in that group-state. Based on these scores, the set of group-states being considered and the group transition matrix TG, the group-state identification module 550 may treat the group of devices, and their transitions, as a hidden Markov model and may identify, for one or more of the observations, a respective most likely group-state using known algorithms for solving hidden Markov models, such as the Viterbi algorithm. Thus, the identification of a group-state for a given measurement period may be based, at least in part, on an obtained time-based vector of total levels of consumption of the utility by the group of devices during one or more measurement periods preceding and/or succeeding the given measurement period or based, at least in part, on an identified most likely group-state for one or more measurement periods preceding and/or succeeding the given measurement period.

The above-mentioned transition matrices $TD_i$ ($1 \leq i \leq Nd$) and TG may be predetermined (i.e. set and fixed prior to actual runtime/monitoring). Alternatively, one or more of these transition matrices may be determined and/or updated during runtime—for example, a transition matrix $TD_i$ for device $D_i$ may be updated during the actual operation and monitoring of the group of devices (e.g. regularly at predetermined time intervals, or after a specified amount of time has passed since the device $D_i$ started operating) so that the transition matrix $TD_i$ more accurately represents how the device $D_i$ is operating in the context of the group of devices.

Utility Usage Estimation

The method 600 may include an optional step S608 at which the processor makes use of the utility usage estimation module 560 to determine a time-based vector $xd_w$ representing estimated levels of consumption of the utility by a given device $D_w$ in the group of devices during the current measurement period. This may be performed for one or more of the devices in the group of devices and the monitoring apparatus 20 may allow a user to identify the particular one or more devices for which this is to be performed.

The estimation of the time-based vector $xd_w$ of levels of consumption of the utility by the device $D_w$ during the current measurement period may be based, at least in part, on the identified most likely group-state $GS_j$ and/or the model $M_j$ for that identified most likely group-state $GS_j$.

In one embodiment, if the most likely group-state that has been identified is the j-th group-state $GS_j$, then the utility usage estimation module 560 may set the estimation of the time-based vector $xd_w$ of levels of consumption of the utility by the device $D_w$ during the current measurement period to be the mean vector $\mu_{DS(w,q(j,w))}$, i.e. the time-based vector $xd_w$ may be set to be the mean vector $\mu_{DS(w,q(j,w))}$ of the device $D_w$ that corresponds to the model $M_j$ for the j-th group-state $GS_j$.

In an alternative embodiment, the utility usage estimation module 560 may determine the time-based vector $xd_w$ based on the set of mean vectors $\mu_{DS(i,k)}$ and covariance matrices $C_{DS(i,k)}$ for the group of devices $D_i$ that corresponds to the model $M_j$ for the j-th group-state $GS_j$. In particular, a more accurate and reliable estimate $xd_w$ may be obtained by setting $$x_{dw} = C_{DS(w,q(j,w))} \left( \sum_{i=1}^{Nds} C_{DS(i,q(j,i))} \right)^{-1} \left( x - \sum_{i=1}^{Nds} \mu_{DS(i,q(j,i))} \right) + \mu_{DS(w,q(j,w))}.$$

The additional term in this equation, which modifies setting $x_{dw}$ from being just $\mu_{DS(w,q(j,w))}$, is derived from a minimization of the errors (or deviations) $e_i$ of the utility consumption of each of the Nd devices $D_i$ from their associated mean $\mu_{DS(i,q(j,i))}$ (i.e. $e_i = xd_i - \mu_{DS(w,q(j,w))}$) subject to the constraint that $$\sum_{i=1}^{Nd} e_i = x - \sum_{i=1}^{Nd} \mu_{DS(i,q(j,i))}$$

—see appendix A.

In general, the above equation may be used regardless of how the group-state for a group of devices is determined. In particular, having obtaining a time-based vector x of total levels of utility consumed by the group of devices during a given measurement period, the processor 26 may determine a corresponding time-based vector representing estimated levels of consumption of the utility by a given device during the given measurement period based on the formula:

$$x_{dw} = C_{dw}\left(\sum_{d \in D} C_d\right)^{-1}\left(x - \sum_{d \in D} \mu_d\right) + \mu_{dw}$$

where D represents the group of devices and, for each device d in the group of devices, $\mu_d$ is a corresponding predetermined mean vector representing a mean of a set of vectors, each vector in the set of vectors being a time-based vector, corresponding to the obtained time-based vector, of levels of consumption of the utility by the device d during a respective measurement period and $C_d$ is a corresponding predetermined covariance matrix representing a covariance matrix of the set of vectors; $\mu_{dw}$ represents the predetermined mean vector corresponding to the given device; $C_{dw}$ represents the predetermined covariance matrix corresponding to the given device; and $x_{dw}$ represents the time-based vector representing estimated levels of consumption of the utility by the given device during the given measurement period. The use of this calculation provides more accurate estimates of the time-based vector of levels of consumption of the utility by the given device during a measurement period than simply using the mean vector $\mu_{dw}$.

In embodiments in which the utility is electricity, the obtained time-based vectors are time-based vectors of levels of current of the electricity supply. Similarly, the mean vectors and covariance matrices correspond to levels of current of electricity. Additionally, then, the step S602 may also comprise obtaining a time-based vector of voltage levels of the supply of electricity to the group of devices during the current measurement period, where this time-based vector of voltage levels corresponds to the obtained time-based vector of total levels of current consumed by the group of devices during the given measurement period. The step S608 may then comprise determining an indication of electrical power consumption by a given device during the current measurement period based on the time-based vector of voltage levels of the supply of electricity to the group of devices during the current measurement period and the time-based vector representing estimated levels of consumption of current by the given device during the given measurement period. For example, the estimate of the electrical power consumption by a given device during the current measurement period may be based on a dot-product, or scalar-product, of these two vectors—in particular, if the time-based vector of voltage levels of the supply of electricity to the group of devices during the current measurement period is a vector v and the time-based vector representing estimated levels of consumption of current by the given device during the given measurement period is a vector i, then the estimate of the electrical power consumption by the given device during the current measurement period may be calculated as $$\frac{1}{N}(v \cdot i).$$

Processing Subsets of Group-States

In the above, the score calculating module 530 calculates a score $S_j$ associated with each of the Ngs group-states $GS_j$ (1≤j≤Ngs). The number of group-states Ngs is exponential in the number of devices Nd, and so some embodiments aim to avoid having to perform an amount of computation, during run time (i.e. when actually monitoring), that is exponentially linked to the number of devices Nd. To reduce the amount of processing carried out by the processor 26 when performing the method 600, the score calculating module 530 may calculate a score $S_j$ for just a subset of the Ngs group-states, i.e. for not all of the possible Ngs group-states but, instead, for only a particular selection or number of the Ngs group-states. The group-state identification module 550 may then identify the most-likely group-state for the group of devices, where this most-likely group-state is selected from the subset of group-states for which the score calculating module 530 calculated a score $S_j$.

For example, if the group-state that was most recently determined for the group of devices was $GS_a$ (i.e. the group of devices was determined to be in the group-state $GS_a$ at the preceding measurement period), then the score calculating module 530, instead of determining scores $S_j$ for each group-state $GS_j$ (1≤j≤Ngs) as set out above, may determine a score $S_b$ for group-state $GS_b$ if the (a,b)-th element of the group transition matrix TG is greater than a predetermined threshold Ω, and may not determine a score $S_c$ for the group-state $GS_c$ if the (a,c)-th element of the group transition matrix TG is less than the predetermined threshold Ω, for 1≤c≤Ngs. In other words, the score calculating module 530 may calculate a score $S_b$ for a group-state $GS_b$ (1≤b≤Ngs) only if the probability of the group of devices transitioning from the current group-state $GS_a$ to that group-state $GS_b$ is sufficiently high (to warrant testing/processing), i.e. is above Ω. This can be used to reduce the amount of processing that the processor 26 carries out in real time (by virtue of having pre-computing the transition matrices before run time and storing the results in the memory 28).

Additionally, or alternatively, if the group-state that was most recently determined for the group of devices was $GS_a$ (i.e. the group of devices was determined to be in the group-state $GS_a$ at the preceding measurement period), then the score calculating module 530, instead of determining scores $S_j$ for each group-state $GS_j$ (1≤j≤Ngs) as set out above, may determine a score $S_b$ for a predetermined number N of the group-states $GS_b$, where these N group-states $GS_b$ for which a score is determined are the group-states which the group transition matrix TG indicates are the N most likely next group-states for the group of devices given that the group of devices is currently in group-state $GS_a$. For example, if one were to order the (a,j)-th elements of TG (1≤j≤Ngs) in descending order, then the group-states considered would correspond to the first N elements of that ordering. In other words, given that the group-state that was most recently determined for the group of devices was $GS_a$, the score calculating module 530 may calculate a score for the group-state $GS_b$ if the (a,b)-th element of the group transition matrix TG is in the top N out of the (a,j)-th elements of the group transition matrix TG (1≤j≤Ngs). Here, N may be a predetermined constant value, or N may be a predetermined percentage of Ngs. Thus, scores $S_j$ are only calculated for a predetermined number of group-states. This can be used to reduce the amount of processing that the processor 26 carries out in real time (by virtue of having pre-computing the transition matrices before run time and storing the results in the memory 28).

Additionally, or alternatively, if the group-state that was most recently determined for the group of devices was $GS_a$ (i.e. the group of devices was determined to be in the group-state $GS_a$ at the preceding measurement period), then the score calculating module 530, instead of determining scores $S_j$ for each group-state $GS_j$ (1≤j≤Ngs) as set out above, may determine a score $S_b$ for a group-state $GS_b$ (1≤b≤Ngs) if transitioning from group-state $GS_a$ to group-state $GS_b$ involves at most a predetermined threshold number V of devices changing their respective device-state. For example, if V is set to be 1, then this equates to the assumption that, between successive measurement periods, at most a single device will have changed its device-state. This can be used to reduce the amount of processing that the processor 26 carries out in real time (by virtue of only considering a small subset of all possible group states.) Additionally, or alternatively, embodiments of the invention may use sampling-based methods to identify a subset of likely group-states for which the score calculating module 530 is to calculate scores $S_j$. This sampling may be sampling in the probabilistic sense based on the group transition matrix TG. In particular, if the current group-state for the group of devices is $GS_a$, then the row of the group transition matrix TG that corresponds to the group of devices currently being in group-state $GS_a$ defines a probability distribution over the entire set of group-states (given that, or conditional on, currently being in group-state being $GS_a$), i.e. each element of that row represents a respective probability of a group-state transition from the current group-state $GS_a$ to a corresponding group-state. By performing probabilistic sampling based on these probabilities, if a group-state transition from group-state $GS_a$ to group state $GS_b$ (including the possibility of the null transition, i.e. remaining in current group-state $GS_a$, so that b=a) is likely, then it is likely that group-state $GS_b$ will be represented in the set of samples, whereas if that group-state transition is unlikely then that group-state $GS_b$ is unlikely to be represented in the set of samples. This is a desirable property of a scheme for choosing a subset of group-states to test. In other words, each of the group-states $GS_j$ ($1 \leq j \leq Ngs$) will have an associated probability, represented in the row of the group transition matrix TG that corresponds to the current group-state $GS_a$, and the processor 26 can sample from the set of group-states $GS_j$ ($1 \leq j \leq Ngs$) based on these respective probabilities in order to determine a subset of the set of group-states $GS_j$ ($1 \leq j \leq Ngs$) for which the score calculating module 530 is to calculate scores $S_j$. The number of samples taken as part of the sampling procedure may be a predetermined number of samples (although the number of different group-states selected by the sampling may be less than this predetermined number due to the nature of sampling from a probability distribution).

As the number of group-states Ngs is exponential in the number of devices Nd, embodiments of the invention may assume that there is independence between the devices. In this case, given that the group of devices is currently in the group-state $GS_a$, then device $D_i$ ($1 \leq i \leq Nd$) is currently in device-state $DS_{i,q(i)}$. Embodiments of the invention may, therefore, perform sampling at the device-level for each device $D_i$ ($1 \leq i \leq Nd$). This device-level sampling may be performed as set out above for group-states, but based on the transition matrix $TD_i$ instead of the group-transition matrix TG this can be used to identify a subset of device-states $DS_{i,k}$ ($1 \leq i \leq Nds(i)$) for device $D_i$. The subset of group-states $GS_j$ ($1 \leq j \leq Ngs$) for which the score calculating module 530 is to calculate scores $S_j$ comprises the group-states that are formed based on each device $D_i$ ($1 \leq i \leq Nd$) being in any one of the device-states from the subset of device-states that was identified by the sampling for that device $D_i$.

The above sampling methods are examples of so-called "particle filtering". Other forms of particular filtering may be used to select a subset of group-states for which to calculate scores $S_j$. A more detailed discussion of particular filtering is given in "A tutorial on Particle Filters for Online Nonlinear/Non Gaussian Bayesian Tracking", Arulampalam et al, IEE Transactions on Signal Processing, Vol. 50, NO. 2, February 2002, the entire disclosure of which is incorporated herein by reference.

The above are examples of determining a subset of group-states for which to calculate scores $S_j$, where this subset of group-states is considered to contain the most likely next group-states for the group of devices given that the group of devices is in a particular current group-state. It will be appreciated that other subsets could be selected accordingly to achieve this aim.

Means and Covariances

As discussed above, each device $D_i$ ($1 \leq i \leq Nd$) may have Nds(i) device-states $DS_{i,1}, \ldots, DS_{i,Nds(i)}$. Each device-state $DS_{i,k}$ ($1 \leq i \leq Nd$, $1 \leq k \leq Nds(i)$) may have an associated mean vector $D_i$ ($1 \leq i \leq Nd$) and an associated covariance matrix $C_{DS(i,k)}$. Each device $D_i$ ($1 \leq i \leq Nd$) may also have its own associated transition matrix $TD_i$. Given this data, for a device $D_i$ ($1 \leq i \leq Nd$), one can calculate a mean vector $\mu_{D(i)}$ and a covariance matrix $C_{D(i)}$ for the device $D_i$ as a whole, as set out below.

The device $D_i$ ($1 \leq i \leq Nd$) with its states $DS_{i,k}$ ($1 \leq k \leq Nds(i)$) and its associated transition matrix $TD_i$ may be viewed as a Markov chain. The stationary distribution of the Markov chain may then be calculated. The stationary distribution may be defined (informally) by starting the chain in an arbitrary configuration, running the chain through a large number of iterations and then measuring the resultant state. More formally, a step of the Markov chain for device ID; can be represented using matrix multiplication—in this case, multiplication by the transpose of the transition matrix $TD_i$. Then, given an arbitrary starting distribution vector s (where the j-th element of s represents a probability that the device $D_i$ is in the j-th device state $DS_{i,j}$), the stationary distribution $Q_i$ for the Markov chain of device $D_i$ is defined by:

$$Q_i = \lim_{n \to \infty} \{(TD_i^T)^n s\}.$$

The j-th element of the stationary distribution $Q_i$ represents the probability that the device $D_i$ is in the device state $DS_{i,j}$ given no recent knowledge of the state of the device $D_i$. It can be shown that this limiting distribution $Q_i$ satisfies $TD_i^T Q_i = Q_i$. $Q_i$ may, therefore, be calculated using standard linear algebra techniques.

The overall vector $\mu_{D(i)}$ for device $D_i$ ($1 \leq i \leq Nd$) may be calculated as $$\mu_{D(i)} = \sum_{j=1}^{Nds(i)} Q_i(j) \mu_{DS(i,j)},$$

where $Q_{i\,(j)}$ is then j-th element of the vector $Q_i$.

The overall covariance $C_{D(i)}$ for device $D_i$ ($1 \leq i \leq Nd$) may be calculated as $$C_{D(i)} = \sum_{j=1}^{Nds(i)} Q_i(j) C_{DS(i,j)} + \sum_{1 \leq j < k \leq Nds(i)} Q_i(j) Q_i(k) (\mu_{DS(i,j)} - \mu_{DS(i,k)})(\mu_{DS(i,j)} - \mu_{DS(i,k)})^T$$

A mean vector for the overall system (i.e. for the group of devices)

$$\mu_{sys} = \sum_{i=1}^{Nd} \mu_{D(i)}$$

may be calculated, and a covariance matrix for the overall system (i.e. for the group of devices)

$$C_{sys} = \sum_{i=1}^{Nd} C_{D(i)}$$

may also be calculated. These quantities may be pre-generated (i.e. prior to actual runtime or prior to active deployment); alternatively, the processor 26 may be arranged to generate and update one or more of these quantities during runtime (i.e. during active deployment/monitoring).

Matrix Operations

As mentioned above, in some embodiments, the inverse of the covariance matrices $C_{GS(j)}$ (1≤j≤Ngs) and/or the inverse of the covariance matrices $C_{DS(i,k)}$ (1≤i≤Nd, 1≤k≤Nds(i)) may be used. In some embodiments, the inverses are stored in the memory 28 (as shown in FIG. 5). However, the number of such inverse matrices grows exponentially with the number of devices—for example, if each device has just 2 device-states, then the number of group-states $N_{gs}$ is $2^{Nds}$. In some embodiments, the memory 28 may be large enough to be able to store all of these matrices. However, in other embodiments, the memory 28 may be more limited, in which case the processor 26 may be arrange to calculate the inverse of a covariance matrix (based on that covariance matrix being stored in the memory 28) as and when that inverse is required instead of storing that inverse in the memory 28.

Calculation of a matrix inverse is, however, computationally expensive. If the dimensionality of the matrix is n, then the complexity of the inverse calculation is between $O(n^2)$ and $O(n^3)$. Embodiments of the invention may, therefore, be arranged to help reduce the amount of processing required when calculating a matrix inverse (e.g. by reducing the dimensionality of the matrices to be inverted).

Regardless of whether or not the matrix inverses are pre-stored in the memory 28 or are calculated during runtime when needed, the amount of processing performed by the processor 26 in carrying out the method 600 can be reduced if the dimensionality of the matrices and vectors involved is reduced. This is particularly useful for embodiments of the invention for which measurement periods occur at a high frequency and/or which have low processing capabilities.

Some preliminary dimensionality reduction (or compression) mathematics is presented below.

Consider a matrix A whose rows are a set of orthonormal vectors. Let the number of orthonormal vectors be $N_{basis}$. Let the dimensionality of data to be processed be $N_{full}$. As the aim is to reduce the dimensionality of the data to be processed, it is assumed that $N_{basis} < N_{full}$. The matrix A therefore has $N_{basis}$ rows and $N_{full}$ columns. The matrix A can be considered to be a linear transformation or map from the higher dimensional space to the lower dimensional one.

Since the rows of A are orthonormal vectors, it follows that $AA^T = I_{basis}$, where $I_{basis}$ is the identity operator in the reduced dimensionality space (i.e. is an $N_{basis} \times N_{basis}$ identity matrix).

For an original (uncompressed) data vector x, compression (or dimensionality reduction) of the data vector x results in a compression vector r, where r=Ax (here, x is treated as a $N_{full} \times 1$ column matrix). This can be used to determine compressed versions of the mean vectors $\mu'_{GS(j)}$ (1≤j≤Ngs) and/or $\mu_{DS(i,k)}$ (1≤i≤Nd, 1≤k≤Nds(i)), namely: $\mu'_{GS(j)} = A\mu_{GS(j)}$ and $\mu'_{DS(i,k)} = A\mu_{DS(i,k)}$. Similarly, for a vector x that is a time-based vector representing total levels of consumption of the utility by the group of devices during a measurement period, a compressed version of x may be determined, namely: x'=Ax.

Similarly, for rank 2 tensors like the covariance matrix, the compression (or dimensionality reduction) can be calculated as follows. A full rank covariance matrix C is defined as $C = E((x-\mu)(x-\mu)^T)$, where E denotes expectation. A compressed version D of the covariance matrix C may be calculated as $$\begin{aligned} D &= E(A(x-\mu)(A(x-\mu))^T) \\ &= E(A(x-\mu)(x-\mu)^T A^T) \\ &= AE((x-\mu)(x-\mu)^T)A^T \\ &= ACA^T \end{aligned}$$

This can be used to determine compressed versions of the covariance matrices $C_{GS(j)}$ (1≤j≤Ngs) and/or $C_{DS(i,k)}$ (1≤i≤Nd, 1≤k≤Nds(i)), namely: $C'_{GS(j)} = AC_{GS(j)}A^T$ and $C'_{DS(i,k)} = AC_{DS(i,k)}A^T$.

Thus, the memory 28 may store compressed mean vectors $\mu'_{GS(j)}$ (1≤j≤Ngs) and/or $\mu'_{DS(i,k)}$ (1≤i≤Nd, 1≤k≤Nds(i)) instead of the original uncompressed mean vectors $\mu_{GS(j)}$ and/or $\mu_{DS(i,k)}$, and may store compressed covariance matrices $C'_{GS(j)}$ (1≤j≤Ngs) and/or $C'_{DS(i,k)}$ (1≤i≤Nd, 1≤k≤Nds(i)) instead of the original uncompressed covariance matrices $C_{GS(j)}$ and/or $C_{DS(i,k)}$. The processor 26, upon receiving or obtaining (at the step S602) a vector x that is a time-based vector representing total levels of consumption of the utility by the group of devices during a measurement period, may convert that vector x into a compressed vector x'. The processor 26 may then perform any of above-mentioned processing using the compressed mean vectors $\mu'_{GS(j)}$ and/or $\mu'_{DS(i,k)}$, the compressed covariance matrices $C'_{GS(j)}$ and/or $C'_{DS(i,k)}$ and the compressed vector x' instead of their uncompressed counterparts. As the dimensionality of the various matrices and vectors has been reduced, the amount of processing required is also reduced.

Since this form of compression process involves data loss the compression is necessarily an approximation. The choice of row vectors for the matrix A determine the extent to which it is a good approximation.

As one example, some embodiments make use of the Fourier basis for the matrix A, i.e. the rows of the matrix A are different Fourier components. Any subset of the full Fourier space could be chosen as the basis set (i.e. the rows for the matrix A).

In embodiments for which the utility is cyclical electricity, the lower frequency components are expected to the most useful and, therefore, the Fourier components used may be based on lower frequency components, ignoring higher frequency components above a certain cut off frequency. In particular, in some embodiments of the invention, for the i-th row of A (0≤i<$N_{basis}$), the j-th element of the i-th row (0≤j<$N_{full}$) (i.e. the (i,j)-th element of A, represented as $A_{ij}$) may be set as:

$$A_{ij} = \begin{cases} \dfrac{1}{\sqrt{N_{full}}} & j = 0 \\ \sin\left(\dfrac{\pi(i+1)j}{N_{full}}\right)\sqrt{\left(\dfrac{2}{N_{full}}\right)}. & j \text{ odd} \\ \cos\left(\dfrac{\pi ij}{N_{full}}\right)\sqrt{\left(\dfrac{2}{N_{full}}\right)} & j > 0 \text{ and } j \text{ even} \end{cases}$$

Here, matrix indices are assumed to start at 0 and it is assumed that $N_{full}$ samples are taken per electrical cycle.

It has been determined that a good value for $N_{basis}$ is 11, so that 5 sine components, 5 cosine components and the DC component are used.

It will be appreciated that other Fourier basis components could be used instead. Similarly, it will be appreciated that other orthonormal sets of vectors could be used as the rows for the matrix A (e.g. vectors for a cosine transform, vectors for a sine transform, or some other basis).

As discussed below, in some embodiments, principal component analysis (PCA) may be used to help determine the rows of the matrix A.

In one embodiment, PCA may be carried out based on the actual live data. In particular, assume that the processor 26 has received or obtained K vectors x(t) (t=1, ..., K) (e.g. at respective instances of the step S602), where each vector x(t) is a time-based vector (of N samples) representing total levels of consumption of the utility by the group of devices during a measurement period. An unbiased estimate of the covariance matrix C of the full population for the vectors x(t) is defined as $$C = \dfrac{1}{K-1}\sum_{t=1}^{K}(x(t)-\mu)(x(t)-\mu)^T \text{ where}$$

$$\mu = \dfrac{1}{K}\sum_{t=1}^{K}x(t).$$

There are various methods of actually calculating the covariance matrix C in practice, any of which may be used.

Having calculated the covariance matrix C, the covariance matrix may be diagonalized. In particular, the covariance matrix C will in general be a symmetric semi-positive definite matrix, i.e. it will have a set of real eigenvectors and real semi-positive eigenvalues. This means that the matrix can be written in the form $C=U\Lambda U^T$, where U is an orthogonal matrix whose columns are the aforementioned normalised real eigenvectors and $\Lambda$ is a diagonal matrix whose diagonal contains the aforementioned semi-positive real eigenvalues. The matrices U and $\Lambda$ may be calculated using any known method.

Each eigenvector (a column of U) can be viewed as a direction accounting for a certain amount of variance about the mean of the vectors x(t). The fraction of the variance accounted for by an eigenvector $e_i$ that has a corresponding eigenvalue $\lambda_i$ is $$f_i = \dfrac{\lambda_i}{\sum_j \lambda_j},$$

where the sum is taken over all the eigenvalues. Therefore the eigenvector with the top eigenvalue is the best at accounting for variation and so on down through the order. The $N_{basis}$ orthonormal vectors making up the rows of the matrix A can, therefore, be chosen to be the $N_{basis}$ eigenvectors corresponding to (or that have) the $N_{basis}$ highest eigenvalues.

It will be appreciated that the above PCA may be carried out each time the step S602 is carried out and a new vector x(t) is received or obtained. Alternatively, the above PCA may be carried out less frequently (to reduce the amount of processing involved), e.g. once every R times the step S602 is carried out, where R is a predetermined number.

In the above PCA, instead of using a covariance matrix C derived from the "live" input data x(t), some embodiments may use the covariance matrix $C_{sys}$ which may be calculated using the above-described methods. The use of $C_{sys}$ in this way may help avoid possible problems/errors that might be introduced if the input data x(t) is not truly representative of the group of appliances in general. Experiments have indicated that the use of $C_{sys}$ in this way to determine the matrix A is preferable over the first PCA method described above, and also over the Fourier basis method described above.

In general, with the above methods, the matrix A may be pre-generated (i.e. prior to actual runtime or prior to active deployment), so that the compressed versions of the mean vectors and covariance matrices can also be pre-generated and stored in the memory 28. Alternatively, the processor 26 may be arranged to generate and/or update the matrix A during runtime (i.e. during active deployment), in which case compressed versions of the mean vectors and covariance matrices may be generated as and when needed and/or as and when the matrix A is updated.

It will be appreciated that embodiments of the invention may be implemented using a variety of different information processing systems. In particular, although FIG. 3 and the discussion thereof provide an exemplary system architecture, these are presented merely to provide a useful reference in discussing various aspects of the invention. Of course, the description of the architecture has been simplified for purposes of discussion, and it is just one of many different types of architecture that may be used for embodiments of the invention. It will be appreciated that the boundaries between logic blocks are merely illustrative and that alternative embodiments may merge logic blocks or elements, or may impose an alternate decomposition of functionality upon various logic blocks or elements.

It will be appreciated that, insofar as embodiments of the invention are implemented by a computer program, then a storage medium and a transmission medium carrying the computer program form aspects of the invention. The computer program may have one or more program instructions, or program code, which, when executed by a computer carries out an embodiment of the invention. The term "program," as used herein, may be a sequence of instructions designed for execution on a computer system, and may include a subroutine, a function, a procedure, an object method, an object implementation, an executable application, an applet, a servlet, source code, object code, a shared library, a dynamic linked library, and/or other sequences of instructions designed for execution on a computer system. The storage medium may be a magnetic disc (such as a hard drive or a floppy disc), an optical disc (such as a CD-ROM, a DVD-ROM or a BluRay disc), or a memory (such as a ROM, a RAM, EEPROM, EPROM, Flash memory or a portable/removable memory device), etc. The transmission medium may be a communications signal, a data broadcast, a communications link between two or more computers, etc.

APPENDIX A

Consider the vector E that tells us the total error of the estimation if we use the means of each device in combination (for ease of notation we drop the time dependence form our terms in what follows). Let be an index that can represent devices in the set A of devices, and let $\mu\{i\}$ be the mean vector for the currently-identified device-state for the i-th device, so that $$E = x - \sum_{i \in A} \mu\{i\}$$

E is made up of deviations of each of the devices' actual utility consumption from their means $\mu\{i\}$. Now let $x\{i\}$ be the utility usage time-based vector due to device i. Thus $$E = \sum_{i \in A} (x\{i\} - \mu\{i\})$$

Let the device errors (i.e. $x\{i\} - \mu\{i\}$) be represented by MO. Therefore we can recast the problem of finding the maximum likelihood utility consumption for a device given the total utility consumption as the problem of finding the maximum likelihood errors $E\{i\}$ subject to $$\sum_{i \in A} E\{i\} = E.$$

The probability of a particular set of independent errors is the product of the probability of each constituent device error. Thus the probability distribution is $$f_E = \frac{1}{N} \prod_{i \in A} e^{-\frac{1}{2} E\{i\}^T C\{i\}^{-1} E\{i\}},$$

where $C\{i\}$ is the covariance matrix for device i.

If we take $P_E = -\ln(f_E)$ then we obtain $$P_E = \sum_{i \in A} \frac{1}{2} E\{i\}^T C\{i\}^{-1} E\{i\} + \ln N$$

Our intention will be to minimize $P_E$ whilst taking into account constraints on the devices. The second term is ignorable because it does not depend on $E\{i\}$ and although N depends on $C\{i\}$ since we have already decided on the device-states the covariance matrices $C\{i\}$ are not variables. To frame this in familiar optimisation terms we use a Lagrange multiplier formulation. That is to say we look for minimum of the related function $$P'_E = \sum_{i \in A} \frac{1}{2} E\{i\}^T C\{i\}^{-1} E\{i\} + \lambda \left(\sum_{i \in A} E\{i\} - E\right)^2$$

Here $\lambda$ is a Lagrange undetermined multiplier. $P'_E$ is a function of each component of each of the vectors. That is to say it is a function of N|A| independent variables. We look for the stationary points of the function by taking the gradient with respect to each of these variables and setting it to 0.

$$\frac{\partial P'_E}{\partial E\{i\}} = C\{i\}^{-1} E\{i\} + 2\lambda \left(\sum_{i \in A} E\{i\} - E\right) = 0 \, \forall \, i \in A$$

The first term depends on i but the second term doesn't since i only appears as a dummy variable. Let us call this second term $-\beta$. Rearranging for $E\{i\}$ we obtain $$E\{i\} = C\{i\}\beta$$

Now let us use the constraint equation to help us solve for $\beta$.

$$\sum_{i \in A} E\{i\} = E = \left(\sum_{i \in A} C\{i\}\right)\beta$$

$$\beta = \left(\sum_{i \in A} C\{i\}\right)^{-1} E$$

Finally re-substituting for $\beta$ we obtain our result for $E\{i\}$ and hence the maximum likelihood error for $x\{i\}$ $$E\{i\} = C\{i\} \left(\sum_{j \in A} C\{j\}\right)^{-1} E$$

The invention claimed is:

1. A method of identifying with a non-intrusive load monitoring apparatus consumption of a utility by devices in a group of devices, wherein each device in the group of devices has a plurality of device-states and is arranged to consume the utility, the method comprising, for a given measurement period in a supply of the utility to the group of devices:

configuring a non-transitory memory to receive and store a predetermined mean vector, $\mu_d$, for each device of a plurality of devices within the group of devices, each predetermined mean vector being a time-based vector of levels of consumption of the utility by that device during a predetermined measurement period for each device-state of the plurality of devices-states for that device;

providing an input module configured to operate with a utility sensor that measures consumption of the utility by the group of devices, the input module obtaining a time-based vector of total levels of consumption of the utility by the group of devices during the given measurement period;

receiving the predetermined mean vector, $\mu_d$, for each device of the plurality of devices within the group of devices, wherein each predetermined mean vector, $\mu_d$, is provided other than by the utility sensor that measures consumption of the utility by the group of devices;

calculating with a processor, for each of a plurality of group-states, wherein each group-state corresponds to each device in the group of devices being in a corresponding device-state, a score representing a likelihood that the group of devices is in the group-state during the given measurement period, wherein said score is based on a likelihood of the obtained vector occurring based on a multivariate statistical model that incorporates the predetermined mean vectors, corresponding to the group-state, of the total level of consumption of the utility by the group of devices during a measurement period in the supply of the utility to the group of devices when the group of devices is in the group-state; identifying, based at least in part on the calculated scores, a most likely group-state for the group of devices; and identifying consumption of the utility by an individual device in the group of devices based at least in part on the most likely group-state for the group of devices, wherein the non-intrusive load monitoring apparatus is automatically calibrated for identifying the consumption of the utility by receiving the predetermined mean vector, $\mu_d$, for each device of the plurality of devices.

2. The method of claim 1, wherein the multivariate statistical model for a group-state is based on:
 a predetermined mean vector, $\mu$, representing a mean of a group of vectors, each vector in the group of vectors being a time-based vector, corresponding to the obtained time-based vector, of total levels of consumption of the utility by the group of devices during a respective measurement period when the group of devices is in the group-state; and
 a predetermined covariance matrix, C, representing a covariance matrix for the group of vectors.

3. The method of claim 2, in which the predetermined covariance matrix of the multivariate statistical model for each group-state is regularized with a regularization parameter ε so that a condition number of each of the predetermined covariance matrices is at most a predetermined value.

4. The method of claim 2, in which the multivariate statistical model for a group-state is based on a multivariate Gaussian model representable by a probability density function f(x), where $$f(x) = \frac{1}{(2\pi)^{N/2}|C|^{1/2}} e^{-\frac{1}{2}(x-\mu)^T C^{-1}(x-\mu)},$$

where x represents the obtained time-based vector, N is the length of the predetermined mean vector, and |C| is the determinant of the predetermined covariance matrix C.

5. The method of claim 1, in which said score is calculated based on the value $a(x-\mu)^T C^{-1}(x-\mu) + \beta \ln(|C|) + \gamma$, wherein α, ß and γ are constants that depend upon the multivariate model being used, where x represents the obtained time-based vector, where μ represents a mean of a group of vectors, each vector in the group of vectors being a time-based vector, corresponding to the obtained time-based vector, of total levels of consumption of the utility by the group of devices during a respective measurement period when the group of devices is in the group-state, C represents a covariance matrix for the group of vectors, and |C| represents the determinant of the predetermined covariance matrix C.

6. The method of claim 1, wherein the multivariate statistical model for a group-state is based on one of a multivariate exponential model, a multivariate gamma model, a multivariate Poisson model, or a multivariate Cauchy-Lorentz model of total levels of consumption of the utility by the group of devices during a respective measurement period when the group of devices is in the group-state.

7. The method of claim 1, comprising determining, based on the multivariate statistical model of the identified most likely group-state, a time-based vector representing estimated levels of consumption of the utility by a given device in the group of devices during the given measurement period.

8. The method of claim 7, wherein:
 the multivariate statistical model for a group-state comprises the predetermined mean vector for the given device, corresponding to the obtained time-based vector during a respective measurement period when the given device is in the device-state corresponding to the group-state; and
 wherein the determined time-based vector representing estimated levels of consumption of the utility by the given device during the given measurement period is the predetermined mean vector for the given device of the multivariate statistical model of the identified most likely group-state.

9. The method of claim 7, wherein:
 the multivariate statistical model for a group-state comprises, for each device, d, of the plurality of devices within the group of devices:
  the predetermined mean vector, $\mu_d$, corresponding to the obtained time-based vector during a respective measurement period when the device is in the device-state corresponding to the group-state; and
  a corresponding predetermined covariance matrix, $C_d$, representing a covariance matrix of the set of vectors that comprise the predetermined mean vector, $\mu_d$;
 wherein the time-based vector representing estimated levels of consumption of the utility by the given device during the given measurement period is determined based on the obtained time-based vector and the predetermined mean vectors corresponding to the devices in the group of devices and the predetermined covariance matrices corresponding to the devices in the group of devices.

10. The method of claim 9, wherein the time-based vector representing estimated levels of consumption of the utility by the given device during the given measurement period is determined based on the formula:

$$x_i = C_i \left( \sum_{d \in D} C_d \right)^{-1} \left( x - \sum_{d \in D} \mu_d \right) + \mu_i$$

where:
 x represents the obtained time-based vector; D represents the group of devices;
 $\mu_i$ represents the predetermined mean vector corresponding to the given device;
 $C_i$ represents the predetermined covariance matrix corresponding to the given device; and
 $x_i$ represents the time-based vector representing estimated levels of consumption of the utility by the given device during the given measurement period.

11. The method of claim 10, wherein the multivariate statistical model for a group-state is based on:
 a predetermined mean vector, μ, representing a mean of a group of vectors, each vector in the group of vectors being a time-based vector, corresponding to the obtained time-based vector, of total levels of consumption of the utility by the group of devices during a respective measurement period when the group of devices is in the group-state, wherein the predetermined mean vector μ is the sum of the predetermined mean vectors corresponding to the devices in the group of devices; and a predetermined covariance matrix, C, representing a covariance matrix for the group of vectors, wherein the predetermined covariance matrix C is the sum of the predetermined covariance matrices corresponding to the devices in the group of devices.

12. The method of claim 1, wherein the utility is electricity and wherein a level of consumption of the utility is a level of consumption of current.

13. The method of claim 1 further comprising identifying that the most likely group-state for the group of devices is not one of the plurality of group-states.

14. The method of claim 13, wherein the most likely group-state for the group of devices is identified as not being one of the plurality of group-states based on a comparison of the calculated scores, or a function of the calculated scores, with a predetermined threshold.

15. The method of claim 1, wherein said identifying a most likely group-state for the group of devices is based, at least in part, on an obtained time-based vector of total levels of consumption of the utility by the group of devices during one or more measurement periods preceding and/or succeeding the given measurement period or is based, at least in part, on an identified most likely group-state for one or more measurement periods preceding and/or succeeding the given measurement period.

16. The method of claim 15, wherein said identifying a most likely group-state for the group of devices comprises using a hidden Markov model for the most likely group-state for the group of devices.

17. The method of claim 1, wherein the supply of the utility to the group of devices has a cyclic component and wherein a measurement period corresponds to one or more cycles of the cyclic component.

18. The method of claim 1, in which the consumption of the utility by a device in the group of devices is dependent upon a current device-state for that device.

19. The method of claim 1, comprising selecting the plurality of group-states from a larger set of possible group-states for the group of devices.

20. The method of claim 19, in which the plurality of group-states is selected as a set of most likely group-states for the group of devices out of the set of possible group-states for the group of devices based on a currently-identified group-state for the group of devices.

21. The method of claim 20, in which the plurality of group-states is selected using a particle filtering process.

22. The method of claim 20, in which the plurality of group-states is selected using a set of transition probabilities.

23. The method of claim 22, wherein each transition probability indicates, for a corresponding first group-state and a corresponding second group-state, a probability that the group of devices will be in the second group-state during a measurement period if the group of devices was in the first group-state during an immediately preceding measurement period.

24. The method of claim 7, wherein the utility is electricity and wherein a level of consumption of the utility is a level of consumption of current, the method further comprising:

obtaining a time-based vector of voltage levels of the supply of electricity to the group of devices during the measurement period corresponding to the obtained time-based vector of total levels of current consumed by the group of devices during the given measurement period; and determining an indication of electrical power consumption by the given device during the given measurement period based on the time-based vector of voltage levels of the supply of electricity to the group of devices during the given measurement period and the time-based vector representing estimated levels of consumption of current by the given device during the given measurement period.

25. The method of claim 2, comprising:

the processor generating and providing said predetermined mean vector, μ, representing a mean of said group of vectors; and the processor generating and providing said predetermined covariance matrix, C, representing a covariance matrix of said group of vectors.

26. The method of claim 1, wherein the predetermined mean vector of one device of the plurality of devices in the group of devices having predetermined mean vectors is at least partially based on a nominal consumption level provided by the manufacturer of the one device.

27. A method of determining with a non-intrusive load monitoring apparatus an indication of a level of consumption of electricity by a given device, the given device being a device in a group of devices that are each arranged to consume electricity, the method comprising, for a given measurement period in a supply of electricity to the group of devices:

configuring a non-transitory memory to receive and store a predetermined mean vector, $\mu_d$, for each device of a plurality of devices within the group of devices, each predetermined mean vector being a time-based vector of levels of consumption of the utility by that device during a predetermined measurement period for each device-state of the plurality of devices-states for that device;

providing an input module configured to operate with an electricity sensor that measures consumption of electricity by the group of devices, the input module obtaining a time-based vector of total levels of current consumed by the group of devices during the given measurement period; and receiving the predetermined mean vector, $\mu_d$, for each device of the plurality of devices within the group of devices, wherein each predetermined mean vector, $\mu_d$, is provided other than by the utility sensor that measures consumption of the utility by the group of devices;

determining with a processor a corresponding time-based vector representing estimated levels of consumption of current by the given device during the given measurement period based on the formula:

$$x_i = C_i \left( \sum_{d \in D} C_d \right)^{-1} \left( x - \sum_{d \in D} \mu_d \right) + \mu_i$$

where:

x represents the obtained time-based vector;

D represents the group of devices;

for each device d in the group of devices, $\mu_d$ is a corresponding predetermined mean vector representing a mean of a set of vectors, each vector in the set of vectors being a time-based vector, corresponding to the obtained time-based vector, of levels of consumption of the current by the device d during a respective measurement period and $C_d$ is a corresponding predetermined covariance matrix representing a covariance matrix of the set of vectors;

$\mu_i$ represents the predetermined mean vector corresponding to the given device;

$C_i$ represents the predetermined covariance matrix corresponding to the given device; and $x_i$ represents the time-based vector representing estimated levels of consumption of current by the given device during the given measurement period; and determining the indication of the level of consumption of electricity by an individual device in the group of devices based at least in part on the corresponding time-based vector determined by the processor, wherein the non-intrusive load monitoring apparatus is automatically calibrated for determining the indication of the level of consumption of electricity by receiving the predetermined mean vector, $\mu_d$, for each device of the plurality of devices.

28. The method of claim 27, further comprising:

the input module obtaining a time-based vector of voltage levels of the supply of electricity to the group of devices during the measurement period corresponding to the obtained time-based vector of total levels of current consumed by the group of devices during the given measurement period; and the processor determining an indication of electrical power consumption by the given device during the given measurement period based on the time-based vector of voltage levels of the supply of electricity to the group of devices during the given measurement period and the time-based vector representing estimated levels of consumption of current by the given device during the given measurement period.

29. A non-intrusive load monitoring apparatus arranged to determine an indication of a level of consumption of a utility by a given device, the given device being a device in a group of devices that are each arranged to consume the utility, the apparatus comprising:

a non-transitory memory that is configured to receive and store a predetermined mean vector, for each device of a plurality of devices within the group of devices, each predetermined mean vector being a time-based vector of levels of consumption of the utility by that device during a predetermined measurement period for each device-state of the plurality of devices-states for that device, wherein the predetermined mean vector, $\mu_d$, for each device of the plurality of devices with the group of devices is provided and stored on the non-transitory memory;

an input module configured to operate with a utility sensor that measures consumption of the utility by the group of devices, the input module obtaining a time-based vector of total levels of the utility consumed by the group of devices during the given measurement period, wherein each predetermined mean vector, $\mu_d$, is provided other than by the utility sensor that measures consumption of the utility by the group of devices;

a processor configured to, for a given measurement period in a supply of the utility to the group of devices, determine a corresponding time-based vector representing estimated levels of consumption of current by the given device during the given measurement period based on the formula:

$$x_i = C_i \left( \sum_{d \in D} C_d \right)^{-1} \left( x - \sum_{d \in D} \mu_d \right) + \mu_i$$

where:

x represents the obtained time-based vector;

D represents the group of devices;

for each device d in the group of devices, $\mu_d$ is a corresponding predetermined mean vector representing a mean of a set of vectors, each vector in the set of vectors being a time-based vector, corresponding to the obtained time-based vector, of levels of consumption of the current by the device d during a respective measurement period and $C_d$ is a corresponding predetermined covariance matrix representing a covariance matrix of the set of vectors;

$\mu_i$ represents the predetermined mean vector corresponding to the given device;

$C_i$ represents the predetermined covariance matrix corresponding to the given device; and $x_i$ represents the time-based vector representing estimated levels of consumption of current by the given device during the given measurement period, to determine the indication of the level of consumption of the utility by an individual device in the group of devices, wherein the non-intrusive load monitoring apparatus is configured to be automatically calibrated to determine the indication of the level of consumption of the utility by receiving the predetermined mean vector, $\mu_d$, for each device of the plurality of devices.

30. The apparatus of claim 29, wherein the utility is electricity, and wherein the processor if further arranged to:

generate and provide said predetermined mean vector, $\mu$, representing a mean of said group of vectors; and generate and provide said predetermined covariance matrix, C, representing a covariance matrix of said group of vectors.

31. A non-transitory computer-readable medium carrying a computer program which, when executed by a processor, is configured to cause the processor to identify with a non-invasive load monitoring device consumption of a utility by devices in a group of devices, wherein each device in the group of devices has a plurality of device-states and is arranged to consume the utility, by, for a given measurement period in a supply of the utility to the group of devices:

the non-transitory computer-readable medium also configured to receive and store a predetermined mean vector, $\mu_d$, for each device of a plurality of devices within the group of devices, each predetermined mean vector being a time-based vector of levels of consumption of the utility by that device during a predetermined measurement period for each device-state of the plurality of devices-states for that device, wherein the predetermined mean vector, $\mu_d$, for each device of the plurality of devices within the group of devices is received and stored on the non-transitory memory;

the computer program obtaining, from a utility sensor that measures consumption of the utility by the group of devices, a time-based vector of total levels of the consumption of the utility by the group of devices during the given measurement period, wherein each predetermined mean vector, $\mu_d$, is provided other than by the utility sensor that measures consumption of the utility by the group of devices;

the computer program, for each of a plurality of group-states, wherein each group-state corresponds to each device in the group of devices being in a corresponding device-state, calculating a score representing a likelihood that the group of devices is in the group-state during the given measurement period, wherein said score is based on a likelihood of the obtained vector occurring based on a multivariate statistical model that incorporates the predetermined mean vectors, corresponding to the group-state, of the total level of consumption of the utility by the group of devices during a measurement period in the supply of the utility to the group of devices when the group of devices is in the group-state;

identifying, based at least in part on the calculated scores, a most likely group-state for the group of devices; and identifying consumption of the utility by an individual device in the group of devices based at least in part on the most likely group-state for the group of devices, wherein the non-intrusive load monitoring apparatus is automatically calibrated for identifying the consumption of the utility by receiving the predetermined mean vector, $\mu_d$, for each device of the plurality of devices.

32. A non-intrusive load monitoring apparatus configured to identify consumption of a utility by devices in a group of devices, wherein each device in the group of devices has a plurality of device-states and is arranged to consume the utility, the non-intrusive load monitoring apparatus comprising a processor configured to, for a given measurement period in a supply of the utility to the group of devices, the apparatus comprising:

a non-transitory memory that is configured to receive and store a predetermined mean vector, $\mu_d$, for each device of a plurality of devices within the group of devices, each predetermined mean vector being a time-based vector of levels of consumption of the utility by that device during a predetermined measurement period for each device-state of the plurality of devices-states for that device, wherein the predetermined mean vector, $\mu_d$, for each device of the plurality of devices within the group of devices is provided and stored on the non-transitory memory;

an input module configured to operate with a utility sensor that measures consumption of the utility by the group of devices, the input module configured to obtain a time-based vector of total levels of consumption of the utility by the group of devices during the given measurement period, wherein each predetermined mean vector, $\mu_d$, is provided other than by the utility sensor that measures consumption of the utility by the group of devices;

a processor configured to, for each of a plurality of group-states, wherein each group-state corresponds to each device in the group of devices being in a corresponding device-state, calculate a score representing a likelihood that the group of devices is in the group-state during the given measurement period, wherein said score is based on a likelihood of the obtained vector occurring based on a multivariate statistical model, corresponding to the group-state, of the total level of consumption of the utility by the group of devices during a measurement period in the supply of the utility to the group of devices when the group of devices is in the group-state;

wherein the processor identifies, based at least in part on the calculated scores, a most likely group-state for the group of devices;

wherein the processor identifies consumption of the utility by an individual device in the group of devices based at least in part on the most likely group-state for the group of devices; and wherein the non-intrusive load monitoring apparatus is automatically calibrated for the processor to identify the consumption of the utility by receiving the predetermined mean vector, $\mu_d$, for each device of the plurality of devices.

* * * * *